(12) United States Patent
Kumagai et al.

(10) Patent No.: US 8,898,615 B2
(45) Date of Patent: Nov. 25, 2014

(54) APPARATUS AND METHOD FOR LAYOUT DESIGN OF SUBSTRATE

(71) Applicant: Fujitsu Limited, Kawasaki-shi, Kanagawa (JP)

(72) Inventors: Kazunori Kumagai, Yokohama (JP); Takahiko Orita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/080,336

(22) Filed: Nov. 14, 2013

(65) Prior Publication Data

US 2014/0201696 A1    Jul. 17, 2014

(30) Foreign Application Priority Data

Jan. 11, 2013  (JP) .................... 2013-004073

(51) Int. Cl.
*G06F 17/50*    (2006.01)
(52) U.S. Cl.
CPC .................... *G06F 17/5077* (2013.01)
USPC ............ 716/130; 716/111; 716/126; 716/129
(58) Field of Classification Search
CPC ............ G06F 17/5072; G06F 17/5077; G06F 17/5081; H01L 2225/06541
USPC .................... 716/111, 126, 129, 130
See application file for complete search history.

(56) References Cited

U.S. PATENT DOCUMENTS 8,006,219 B2    8/2011  Nishio et al.
2012/0020027 A1* 1/2012  Dungan et al. ................ 361/718

FOREIGN PATENT DOCUMENTS

| JP | 06-236419 | 8/1994 |
| JP | 08-180091 | 7/1996 |
| JP | 08-221458 | 8/1996 |
| JP | 2002-140380 | 5/2002 |
| JP | 2008-243230 | 10/2008 |
| JP | 2009-122764 | 6/2009 |
| JP | 2009-301351 | 12/2009 |

* cited by examiner

*Primary Examiner* — Vuthe Siek
(74) *Attorney, Agent, or Firm* — Fujitsu Patent Center

(57) ABSTRACT

A receiving unit receives specification of two parts to be connected by wirings and the number of wirings connecting the two parts. A generating unit generates a schematic route connecting the two parts on a substrate with a width in accordance with the number of wirings received by the receiving unit. A derivation unit derives the number of arrangeable wirings by checking interference whether the schematic route generated by the generating unit is capable of being arranged on the substrate.

5 Claims, 22 Drawing Sheets

FIG.2

| WIRING WIDTH | ALLOWABLE INTERVAL |
|---|---|
| 0.1 mm | 0.3 mm |

FIG.3

| SUBSTRATE SHAPE [mm] |
|---|
| RECTANGULAR SHAPE (0.0, 0.0)-(250.0, 200.0) |

FIG.4

| PART NAME | PART SHAPE [mm] | ANGLE | CENTER COORDINATES [mm] |
|---|---|---|---|
| IC1 | RECTANGULAR SHAPE (2.5, 4.2)-(22.5, 24.2) | 0 DEGREES | (12.5, 14.2) |
| IC2 | RECTANGULAR SHAPE (5.6, 14.0)-(25.6, 34.0) | 90 DEGREES | (15.6, 24.0) |
| ⋮ | ⋮ | ⋮ | ⋮ |
| R10 | RECTANGULAR SHAPE (238.0, 184.6)-(242.0, 192.6) | 180 DEGREES | (240.0, 188.6) |

FIG.5

| STARTING POINT PART NAME | ENDING POINT PART NAME | NUMBER OF REQUESTED WIRINGS | NUMBER OF ARRANGE-ABLE WIRINGS | NUMBER OF PATH COORDI-NATES | PATH COORDI-NATES 1 | ... | PATH COORDI-NATES n | NUMBER OF ROUTE SHAPES | ROUTE SHAPE 1 | ... | ROUTE SHAPE n |
|---|---|---|---|---|---|---|---|---|---|---|---|
| IC1 | IC5 | 30 | 30 | 8 | (30.0, 28.2) | ... | ... | 7 | OVAL (30.0, 28.2)–(40.0, 28.2) R=5.8 | ... | ... |
| IC2 | IC1 | 20 | 20 | 12 | (28.5, 30.0) | ... | ... | 11 | OVAL (28.5, 30.0)–(45.2, 30.0) R=3.8 | ... | ... |
| ... | ... | ... | ... | ... | ... | ... | ... | ... | ... | ... | ... |
| IC5 | IC3 | 30 | 30 | 4 | (205.6, 160.0) | ... | ... | 3 | OVAL (205.6, 160.0)–(205.6, 85.0) R=5.8 | ... | ... |

| REGION SHAPE |
|---|
| RECTANGULAR SHAPE (0.0, 15.0)-(200.0, 200.0) |
| RECTANGULAR SHAPE (60.5, 85.5)-(80.5, 105.5) |
| ⋮ |
| RECTANGULAR SHAPE (190.0, 33.5)-(200.0, 43.5) | ized
APPARATUS AND METHOD FOR LAYOUT DESIGN OF SUBSTRATE

CROSS-REFERENCE TO RELATED APPLICATIONS

This application is based upon and claims the benefit of priority of the prior Japanese Patent Application No. 2013-004073, filed on Jan. 11, 2013, the entire contents of which are incorporated herein by reference.

FIELD

The embodiments discussed herein are directed to a design support apparatus and a design support method.

BACKGROUND

In recent years, it has been difficult to perform design layout of a substrate with increase in a circuit size and densification. For example, several parts having a large number of terminals as much as several thousands are arranged on a printed substrate and the number of sections to be wired reaches several tens of thousands. In addition, layout design of the substrate has functional constraint and constraint in manufacturing in some cases. When a designer performs layout design of the substrate, the designer examines arrangement positions of parts in consideration of the functional constraint and the constraint in manufacturing so as to examine whether wiring among the arranged parts is capable of being performed.

There are techniques for supporting the layout design on the substrate. For example, there is a technique for supporting the layout design by using network information that relates terminals of respective parts to be connected. Conventional examples are described in Japanese Laid-open Patent Publication No. 08-180091, Japanese Laid-open Patent Publication No. 06-236419, and Japanese Laid-open Patent Publication No. 2009-122764.

With the conventional techniques, layout design is incapable of being performed unless positions of the terminals of the parts to be arranged on the substrate and the terminals of the parts to be connected are defined.

If the layout design is performed after the positions of the terminals of the parts and the terminals of the parts to be connected are defined, for example, the designed parts are incapable of being arranged on the substrate and rework to the design of the parts occurs in some cases. In order to shorten a design period, it is preferable that the layout design of the substrate can be performed at an early stage during design of the parts.

SUMMARY

According to an aspect of an embodiment, a design support apparatus includes: a receiving unit that receives specification of two parts to be connected by wirings and number of wirings connecting the two parts; a generating unit that generates a schematic route connecting the two parts on a substrate with a width in accordance with the number of wirings received by the receiving unit; and a derivation unit that derives number of arrangeable wirings by checking interference whether the schematic route generated by the generating unit is capable of being arranged on the substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a table illustrating an example of a data structure of mounting specification information;
FIG. 3 is a table illustrating an example of a data structure of substrate information;
FIG. 4 is a table illustrating an example of a data structure of part information;
FIG. 5 is a table illustrating an example of a data structure of schematic route information.

DESCRIPTION OF EMBODIMENTS

Preferred embodiments of the present invention will be explained with reference to accompanying drawings. The invention is not limited to the embodiments. The embodiments can be combined appropriately within a range where processing contents are consistent.

[a] First Embodiment

Figure 1:
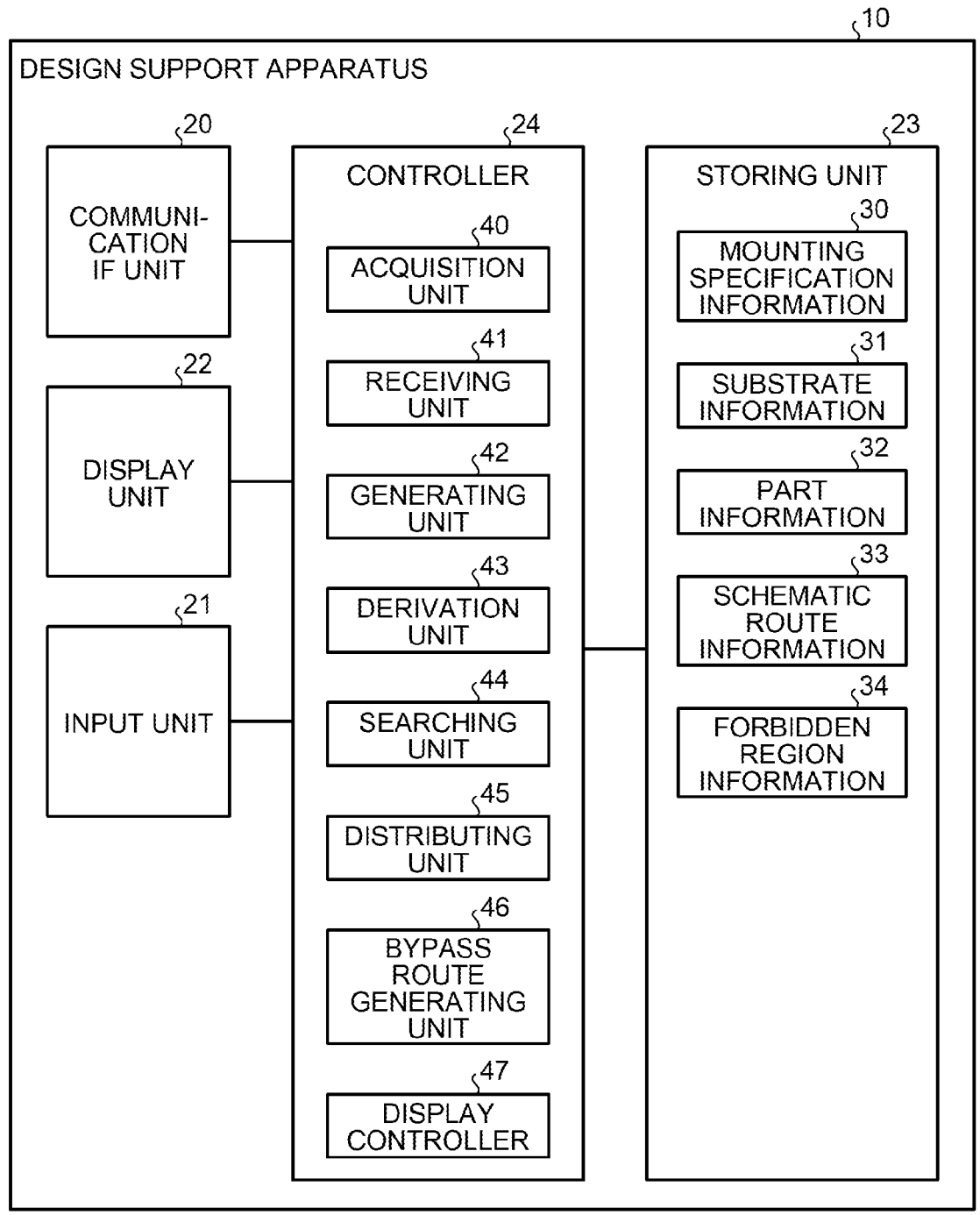
FIG. 1 is a diagram illustrating an overall configuration of a design support apparatus.

Described first is a design support apparatus 10 according to a first embodiment. FIG. 1 is a diagram illustrating an overall configuration of the design support apparatus. The design support apparatus 10 is an apparatus that arranges parts on a substrate such as a printed substrate and supports schematic layout design of the substrate. For example, the design support apparatus 10 is a computer such as a personal computer and a server computer. The design support apparatus 10 may be mounted as one computer or can be mounted as a cloud by a plurality of computers. In the embodiment, described is the case where the design support apparatus 10 is mounted as one computer, as an example. The design support apparatus 10 may be a design apparatus in which circuit design software for supporting circuit design by a designer operates, such as a computer aided design (CAD) apparatus. As illustrated in FIG. 1, the design support apparatus 10 includes a communication interface (I/F) unit 20, an input unit 21, a display unit 22, a storing unit 23, and a controller 24.

The communication I/F unit 20 is an interface that controls communication between the design support apparatus 10 and another apparatus. The communication I/F unit 20 transmits and receives various pieces of information to and from another device through network (not illustrated). The communication I/F unit 20, for example, receives information relating to names of parts and outer shapes of the parts from a server computer storing therein various pieces of design data of the parts to be arranged on the substrate. As the communication I/F unit 20, a network interface card such as a local area network (LAN) card can be employed. The design support apparatus 10 may acquire information relating to the outer shapes of the parts through a storage medium such as a memory card.

The input unit 21 is an input device that inputs various pieces of information. An operation reception device such as a mouse and a keyboard is employed as the input unit 21. The input unit 21 receives various pieces of information. The input unit 21, for example, receives registration of parts to be arranged on the substrate. Furthermore, the input unit 21 receives specification of the parts to be arranged on the substrate and specification of arrangement positions of the parts. The input unit 21 receives specification of the parts to be connected by wirings on a schematic route and specification of the number of connecting wirings. The input unit 21 inputs operation information indicating the received operation contents to the controller 24.

The display unit 22 is a display device that displays various pieces of information. As the display unit 22, a display device such as a liquid crystal display (LCD) and a cathode ray tube (CRT) is employed. The display unit 22 displays various pieces of information. The display unit 22, for example, displays a design screen on which layout design of the substrate is performed schematically by arranging various types of parts and wirings on the substrate. The design screen, for example, displays the substrate serving as a design target and various types of parts to be arranged on the substrate. Furthermore, the display unit 22 displays a specification screen on which parts to be connected by wirings and the number of connecting wirings are specified.

The storing unit 23 is a storage device such as a hard disk, a solid state drive (SSD), and an optical disk. The storing unit 23 may be a data-rewritable semiconductor memory such as a random access memory (RAM), a flash memory, and a non-volatile static random access memory (NVSRAM).

The storing unit 23 stores therein an operating system (OS) and various types of programs that are executed by the controller 24. The storing unit 23, for example, stores therein a program to be used for supporting design, which will be described later. Furthermore, the storing unit 23 stores therein various pieces of data to be used for the programs that are executed by the controller 24. The storing unit 23, for example, stores therein mounting specification information 30, substrate information 31, part information 32, schematic route information 33, and forbidden region information 34.

The mounting specification information 30 is data storing information relating to mounting conditions when mounting is performed on the substrate. In the embodiment, the mounting specification information 30 stores one condition relating to wiring as the information relating to the mounting conditions. As an example, the mounting specification information 30 may be registered previously on a creation source of the design support software. Alternatively, the mounting specification information 30 may be registered through the input unit 21 or a terminal apparatus such as a client computer that is capable of communicating with the design support apparatus 10 by a designer.

FIG. 2 is a table illustrating an example of a data structure of the mounting specification information. As illustrated in FIG. 2, the mounting specification information 30 has items "wiring width" and "allowable interval". The width of a wiring to be used for layout design is stored in the item "wiring width". A lower limit interval set between wirings when a plurality of wirings are arranged on the layout design is stored in the item "allowable interval". The example of FIG. 2 indicates that the wiring width is 0.1 mm and the allowable interval is 0.3 mm.

Referring back to FIG. 1, the substrate information 31 is data storing information relating to the substrate serving as the design target. As an example, the substrate information 31 may be registered previously on the creation source of the design support software. Furthermore, the substrate information 31 may be registered through the input unit 21 or the terminal apparatus such as the client computer that is capable of communicating with the design support apparatus 10 by the designer.

FIG. 3 is a table illustrating an example of a data structure of the substrate information. As illustrated in FIG. 3, the substrate information 31 has an item "substrate shape". The item "substrate shape" indicates a region for storing information indicating the shape of the substrate. In the embodiment, the shape of the substrate is indicated by two-dimensional coordinates defined with respect to the X axis and the Y axis. In the embodiment, when the substrate has a rectangular shape, coordinates of two opposed vertices of the substrate are stored as the substrate shape. It is noted that coordinates of the respective vertices of the outer shape of the substrate may be stored as the substrate shape. The example of FIG. 3 indicates that the substrate has a rectangular shape of 250.0 mm in the X direction and 200.0 mm in the Y direction because the coordinates of the two opposed vertices of the substrate are (0.0, 0.0) and (250.0, 200.0).

Referring back to FIG. 1, the part information 32 is data storing information relating to parts arranged on the substrate. As an example, the part information 32 may be registered from a registration screen (not illustrated) on which the designer registers the parts by using the input unit 21. Alternatively, the part information 32 may be registered by acquiring information relating to the outer shapes of the parts from another apparatus that designs the parts by using an acquisition unit 40.

FIG. 4 is a table illustrating an example of a data structure of the part information. As illustrated in FIG. 4, the part information 32 has items "part name", "part shape", "angle", and "center coordinates". The item "part name" indicates a region for storing information that identifies each part. Identification information identifying each part, such as a part name and a part number, is defined for each part. The identification information of each arranged part is stored in the item "part name". The item "part shape" indicates a region for storing information indicating the shape of each part. In the embodiment, the shape of the part is indicated by two-dimensional coordinates defined with respect to the X axis and the Y axis. In the embodiment, when the part has a rectangular shape, coordinates of two opposed vertices of the part are stored as the part shape. It is noted that coordinates of the respective vertices of the outer shape of the part may be stored as the part shape. The item "angle" indicates a region for storing a rotating angle of each part. In the embodiment, each part can be rotated to be arranged. A rotating angle when each part is rotated to be arranged is stored in the item "angle". The item "center coordinates" indicates a region for storing information indicating the center position of each part. The center coordinates of each arranged part are stored in the item "center coordinates". The example of FIG. 4 indicates that a part whose part name is "IC1" is a rectangular part having two opposed vertices of (2.5, 4.2) and (22.5, 24.2), the rotating angle of the part is "0" degrees, and the center coordinates are (12.5, 14.2).

Referring back to FIG. 1, the schematic route information 33 is data storing information relating to schematic routes schematically indicating wirings connecting the parts arranged on the substrate. As an example, a generating unit 42, which will be described later, registers the schematic route information 33.

FIG. 5 is a table illustrating an example of a data structure of the schematic route information. As illustrated in FIG. 5, the part information 32 has items "starting point part name", "ending point part name", "number of requested wirings", "number of arrangeable wirings", "number of path coordinates", "path coordinates", "number of route shapes", and "route shape". The item "path coordinates" includes a plurality of items "path coordinates 1" to "path coordinates n". The item "number of route shapes" includes a plurality of items "route shape 1" to "route shape n". A sufficient number of the items "path coordinates" and "number of route shapes" may be provided previously. The item "path coordinates" for the number of the item "number of path coordinates" may be provided and the item "number of route shapes" for the number of the item "number of route shapes" may be provided. That is to say, the number of the items "path coordinates" and "number of route shapes" may be variable for each record. The item "starting point part name" indicates a region for storing identification information of a part at a starting point of each schematic route. The item "ending point part name" indicates a region for storing identification information of a part at an ending point of each schematic routes. The item "number of requested wirings" indicates a region for storing the number of wirings requested as wirings connecting the parts. The item "number of arrangeable wirings" indicates a region for storing the number of arrangeable wirings that are capable of being arranged on each schematic route. The item "number of path coordinates" indicates a region for storing the number of positions at which the wiring direction of each schematic route is changed. The "number of path coordinates" indicates a region for storing the coordinates of the positions at which the wiring direction of each schematic route is changed. The item "number of route shapes" indicates a region for storing the number of positions at which the shape of each schematic route is specified. The item "route shape" indicates a region for storing coordinates of the position at which the shape of each schematic route is specified. The example of FIG. 5 indicates that a schematic route connecting a part whose part name is "IC1" and a part whose part name is "IC5" has "30" requested wirings, and "30" arrangeable wirings. Furthermore, the example of FIG. 5 indicates that the schematic route connecting the part whose part name is "IC1" and the part whose part name is "IC5" has "8" path coordinates and passes through coordinates (30.0, 28.2). In addition, the example of FIG. 5 indicates that the schematic route connecting the part whose part name is "IC1" and the part whose part name is "IC5" has "7" route shapes and has an oval shape of R=5.8 for (30.0, 28.2) and (40.0, 28.2).

Referring back to FIG. 1, the forbidden region information 34 is data storing information relating to a forbidden region on which wirings are incapable of being arranged on the substrate. As an example, the forbidden region information 34 may be registered previously on the creation source of the design support software. Alternatively, the forbidden region information 34 may be registered through the input unit 21 or the terminal apparatus such as the client computer that is capable of communicating with the design support apparatus 10 by the designer.

Figures 6, 7:
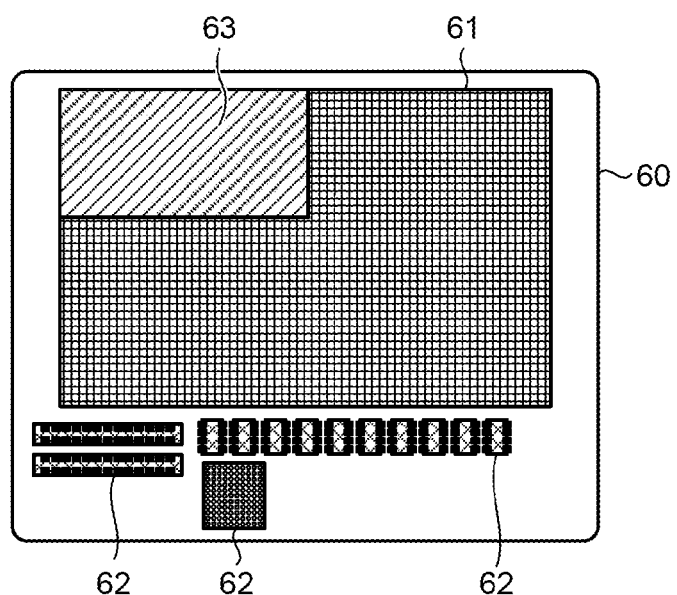
FIG. 6 is a table illustrating an example of a data structure of forbidden region information.
FIG. 7 is a view illustrating an example of a design screen.

FIG. 6 is a table illustrating a data structure of the forbidden region information. As illustrated in FIG. 6, the forbidden region information 34 has an item "region shape". The item "region shape" indicates a region for storing information indicating the shape of the forbidden region on which wirings are forbidden to be arranged on the substrate. In the embodiment, the shape of the forbidden region is indicated by two-dimensional coordinates defined with respect to the X axis and the Y axis. In the embodiment, when the forbidden region has a rectangular shape, coordinates of two opposed vertices of the forbidden region are stored as the region shape. It is noted that coordinates of the respective vertices of the outer shape of the forbidden region may be stored as the region shape. The example of FIG. 6 indicates that a rectangular region whose two opposed vertices are located at (0.0, 15.0) and (200.0, 200.0) is the forbidden region.

Referring back to FIG. 1, the controller 24 is a device that controls the design support apparatus 10. As the controller 24, an electronic circuit such as a central processing unit (CPU) and a micro processing unit (MPU) or an integrated circuit such as an application specific integrated circuit (ASIC) and a field programmable gate array (FPGA) can be employed. The controller 24 includes an internal memory for storing therein programs defining various processing procedures and control data and executes various pieces of processing by using them. The controller 24 functions as various types of processors if various types of programs operate. The controller 24, for example, includes the acquisition unit 40, a receiving unit 41, the generating unit 42, a derivation unit 43, a searching unit 44, a distributing unit 45, a bypass route generating unit 46, and a display controller 47.

The acquisition unit 40 acquires various pieces of information. The acquisition unit 40, for example, accesses a server computer storing therein various pieces of design data of parts to be arranged on the substrate so as to acquire information relating to the parts. The acquisition unit 40, for example, acquires information relating to the part names of the parts and the outer shapes of the parts that are being designed from the server computer. The acquisition unit 40 registers, in the part information 32, the part names and the outer shapes of the parts based on the acquired information relating to the part names and the outer shapes of the parts. The acquisition of the information relating to the parts from the server computer by the acquisition unit 40 is not necessarily performed.

The receiving unit 41 performs various types of reception. The receiving unit 41, for example, receives registration of the parts to be arranged on the substrate. The receiving unit 41, for example, displays a registration screen (not illustrated) on which the part names and coordinates of the outer shapes of the parts are registered and receives registration of the parts to be arranged on the substrate from the registration screen. When the parts are registered from the registration screen, the receiving unit 41 registers, in the part information 32, the information relating to the part names of the parts and the outer shapes of the parts that are registered. The receiving unit 41, for example, displays a design screen on which layout design of the substrate is performed and receives a direction of arrangement of various parts on the substrate. Furthermore, for example, when a predetermined operation directing arrangement of wirings is made on the design screen, the receiving unit 41 displays a specification screen on which conditions relating to the wirings are specified and receives the direction of arrangement of the wirings.

FIG. 7 is a view illustrating an example of the design screen. A design screen 60 displays a substrate 61 as a design target based on the substrate information 31. The substrate 61 is provided with a forbidden region 63 on which wirings are incapable of being arranged based on the forbidden region information 34. Parts 62 are arranged on the periphery of the substrate 61 on the design screen 60 based on the part information 32. Note that although the position of a circuit may be specified arbitrarily on circuit design, grids are arranged virtually at a constant interval on the substrate for making specification of positions easier and positions are specified based on the grids. The design screen 60 displays the grids on the substrate 61 in a lattice form.

Figure 8:
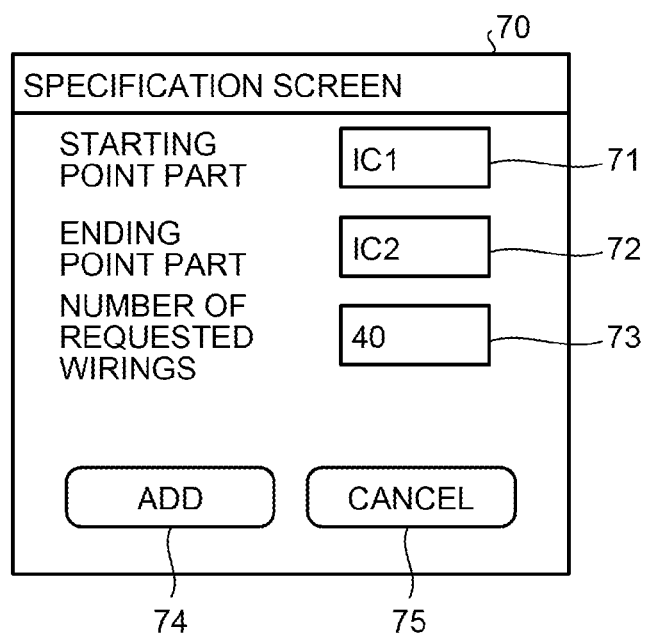
FIG. 8 is a view illustrating an example of a specification screen.

FIG. 8 is a view illustrating an example of the specification screen. A specification screen 70 includes an input region 71 for specifying a part at a starting point of wiring, an input region 72 for specifying a part at an ending point of the wiring, and an input region 73 for specifying the number of requested connecting wirings. In addition, the specification screen 70 includes an addition button 74 for directing to add wiring and a cancel button 75 for directing to cancel.

The generating unit 42 performs various types of generation. When addition of the wiring is specified on the specification screen 70, for example, the generating unit 42 generates a schematic route connecting two parts at the starting point and the ending point that are specified on the specification screen 70 with a width in accordance with the specified number of wirings.

When two parts for which addition of the wiring is directed are arranged on the substrate, for example, the generating unit 42 searches a schematic route of wirings connecting the two parts. The generating unit 42, for example, reads a wiring width and an allowable interval from the mounting specification information 30. Then, the generating unit 42 calculates a width W of the schematic route from the number of wirings requested on the specification screen 70, the wiring width, and the allowable interval. The generating unit 42, for example, performs an operation of "the number of requested wirings×(wiring width+allowable interval)−allowable interval" so as to calculate the width W of the schematic route. Portions on which the allowable interval is provided correspond to portions between the wirings, so that the number of allowable intervals is less than the number of wirings by one. Based on this, in the above-mentioned operation, the number of allowable intervals that is less than the number of wirings by one is expressed by subtracting the allowable interval last.

The generating unit 42 obtains check regions that are used for determining whether the schematic route is capable of being arranged on the substrate. The generating unit 42, for example, obtains the check regions by enlarging widths of the parts and the forbidden region on the substrate other than the two parts specified on the specification screen 70 by W/2. Furthermore, the generating unit 42 obtains check regions by enlarging widths of other schematic routes that are already arranged by widths each obtained by adding the allowable interval to W/2.

The generating unit 42 specifies a region that is not included in the check regions on the substrate and generates an undirected graph in which grids on the region that is not included in the check regions are set as nodes and lines connecting upper, lower, right, and left grids are set as edges. The generating unit 42 searches a wiring path such that the wiring path does not overlap with the check regions. To be more specific, the generating unit 42 searches the wiring path from the generated undirected graph by using a route search algorithm such as a maze method, for example. It is noted that the search method of the wiring path is not limited thereto and any method may be used as long as the method makes it possible to search a wiring path that does not overlap with the forbidden region, the parts, and other schematic routes on the substrate.

Figure 9:
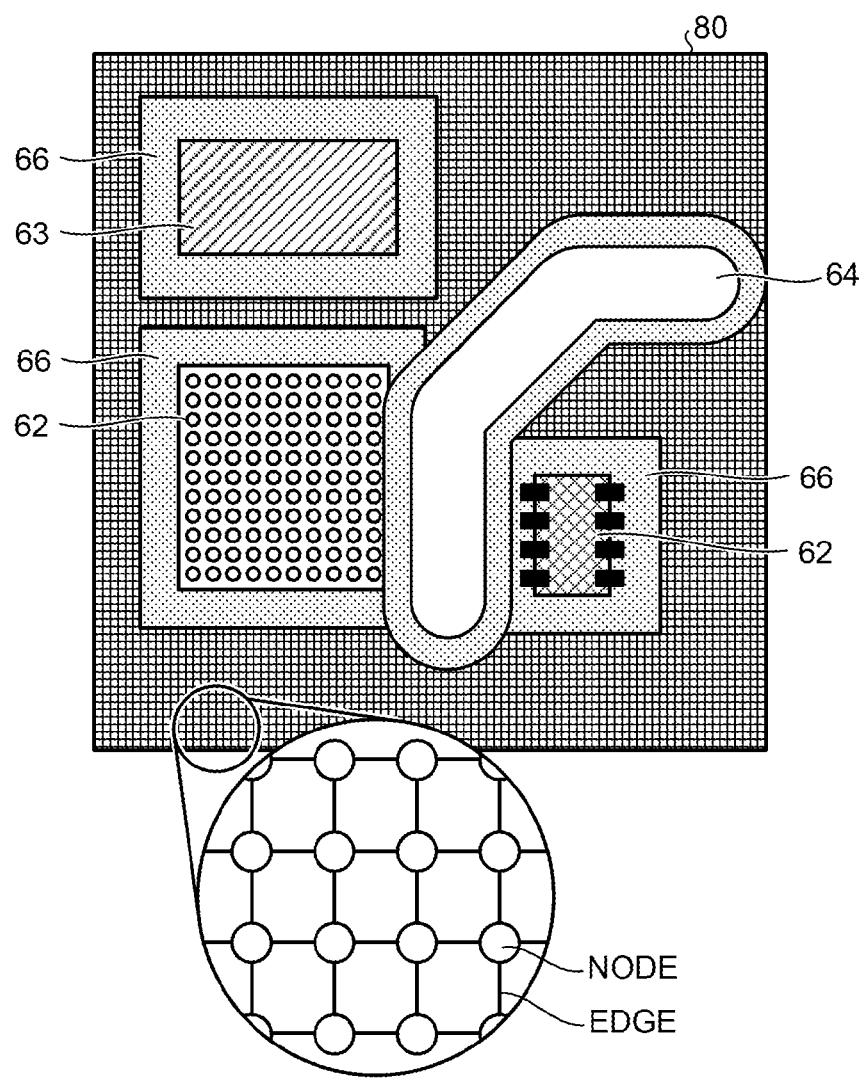
FIG. 9 is a view illustrating an example of an undirected graph.

FIG. 9 is a view illustrating an example of the undirected graph. In the example of FIG. 9, a plurality of parts 62 are arranged on an undirected graph 80. Furthermore, the undirected graph 80 is provided with the forbidden region 63. The undirected graph 80 is provided with check regions 66 around the parts 62 and the forbidden region 63. In the example of FIG. 9, a schematic route 64 is searched as a wiring path.

When there is the wiring path as a result of the search, the generating unit 42 corrects both ends of the wiring path to positions of the parts specified on the specification screen 70. Then, the generating unit 42 stores, in the schematic route information 33, information relating to the two parts specified on the specification screen 70, the number of connecting wirings, and the corrected wiring path.

By contrast, when there is no wiring path as a result of the search, the generating unit 42 generates an undirected graph, includes check regions, in which all the grids on the substrate are set as nodes and lines connecting upper, lower, right, and left grids are set as edges, thereby searching a wiring path.

The derivation unit 43 performs various types of derivation. The derivation unit 43, for example, checks interference to verify whether the generated schematic route is capable of being arranged on the substrate and derives the number of arrangeable wirings. The derivation unit 43, for example, reads the wiring width and the allowable interval from the mounting specification information 30. The derivation unit 43 increases a width of the schematic route to the number of requested wirings from one gradually by using the wiring width and the allowable interval for each schematic route generated by the generating unit 42. Then, the derivation unit 43 determines whether the schematic route interferes with the parts, the forbidden region, or other schematic routes and derives the maximum number of wirings with which interference is not generated as the number of arrangeable wirings.

Figure 10:
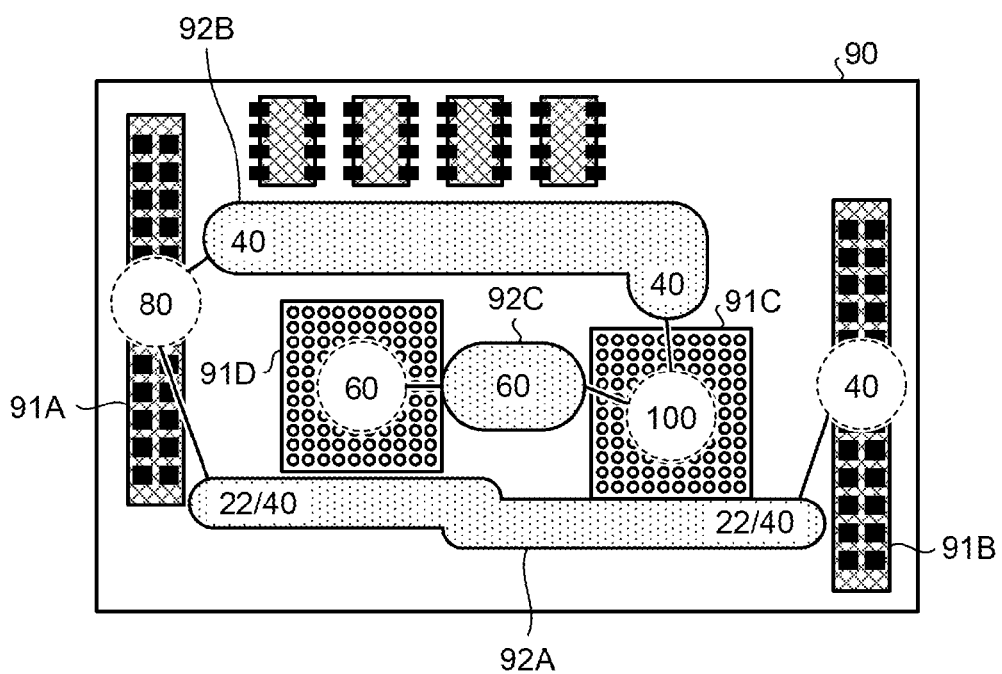
FIG. 10 is a view illustrating an example of schematic routes.

FIG. 10 is a view illustrating an example of the schematic route. In the example of FIG. 10, a part 91A and a part 91B on a substrate 90 are connected by a schematic route 92A. "22/40" is displayed on the schematic route 92A because the number of requested wirings is 40 and the number of arrangeable wirings is 22. Furthermore, the part 91A and a part 91C are connected by a schematic route 92B. "40" is displayed on the schematic route 92B because the number of requested wirings is 40 and the number of arrangeable wirings is also 40. The part 91C and a part 91D are connected by a schematic route 92C. "60" is displayed on the schematic route 92C because the number of requested wirings is 60 and the number of arrangeable wirings is also 60. In addition, the total number of wirings requested to connect the parts is displayed on each part to which schematic routes are connected. For example, the total number "80" of 40 wirings requested on the schematic route 92A and 40 wirings requested on the schematic route 92B is displayed on the part 91A. "40" is displayed on the part 91B because 40 wirings are requested on the schematic route 92A. The total number "100" of 40 wirings requested on the schematic route 92B and 60 wirings requested on the schematic route 92C is displayed on the part 91C. Furthermore, "60" is displayed on the part 91D because 60 wirings are requested on the schematic route 92C. The example of FIG. 10 illustrates the case where the different parts are connected by the respective schematic routes. Alternatively, a plurality of schematic routes on which parts at the starting point and the ending point are the same can be also generated by generating a schematic route a plurality of times while setting the parts at the starting point and the ending point to be the same on the specification screen 70.

Referring back to FIG. 1, the searching unit 44 performs various types of search. When there is a schematic route on which the number of arrangeable wirings derived by the derivation unit 43 is smaller than the number of requested wirings, for example, the searching unit 44 searches other schematic routes that connect the same parts as the schematic route. The searching unit 44, for example, searches other schematic routes whose parts at the starting points and the ending points are the same as those on the schematic route on which the number of arrangeable wirings is smaller than the number of requested wirings.

The distributing unit 45 performs various types of distribution. The distributing unit 45, for example, distributes a part of the wirings on the schematic route on which the number of arrangeable wirings is smaller than the number of requested wirings to other schematic routes searched by the searching unit 44. The distributing unit 45, for example, reads the wiring width and the allowable interval from the mounting specification information 30. Then, the distributing unit 45 increases the number of wirings one by one for other schematic routes searched by the searching unit 44 and determines whether the schematic routes interfere with the parts, the forbidden region, or other schematic routes so as to specify the number of arrangeable wirings. Then, the distributing unit 45 distributes a part of wirings to a schematic route on which the number of arrangeable wirings is larger than the number of requested wirings among the other searched schematic routes.

Figure 11:
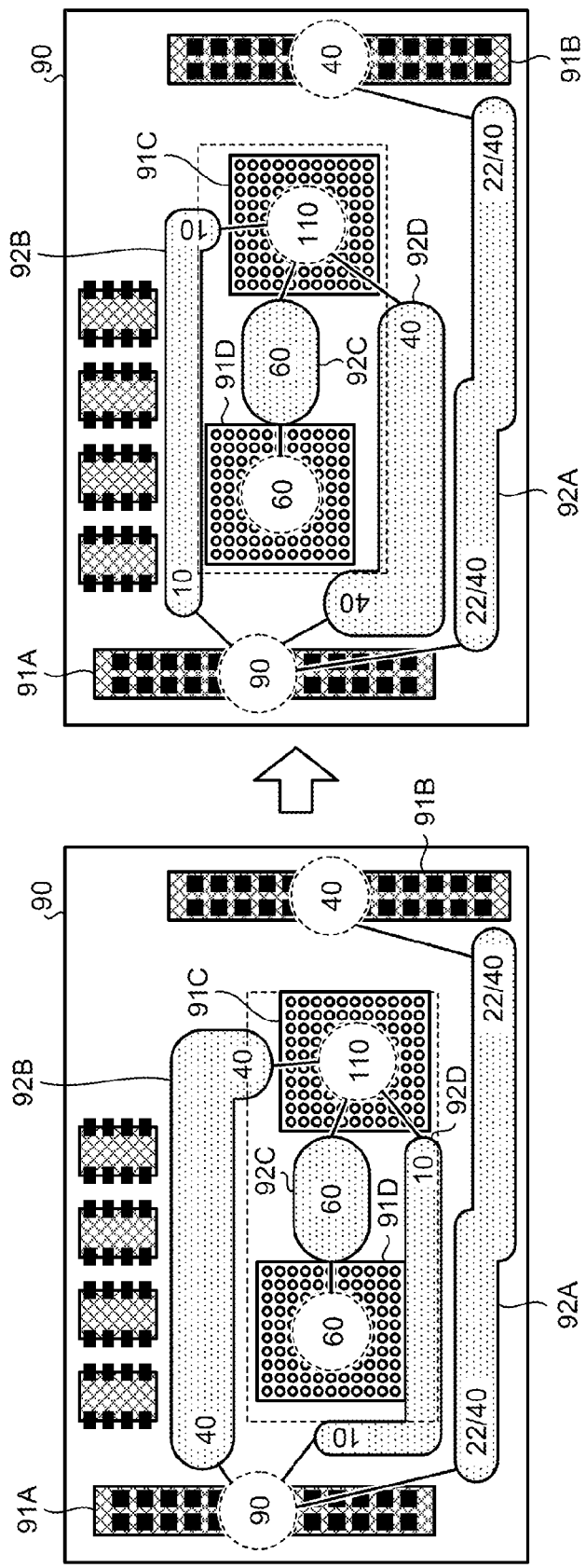
FIG. 11 is a view illustrating an example of distribution on schematic routes.

FIG. 11 is a view illustrating an example of distribution of the schematic route. In an example of a left-side view in FIG. 11, the part 91A and the part 91B on the substrate 90 are connected by the schematic route 92A. "22/40" is displayed on the schematic route 92A because the number of requested wirings is 40 and the number of arrangeable wirings is 22. The part 91A and the part 91C are connected by the schematic route 92B. "40" is displayed on the schematic route 92B because the number of requested wirings is 40 and the number of arrangeable wirings is also 40. The part 91C and the part 91D are connected by the schematic route 92C. "60" is displayed on the schematic route 92C because the number of requested wirings is 60 and the number of arrangeable wirings is also 60. Furthermore, the part 91A and the part 91C are connected by a schematic route 92D. "10" is displayed on the schematic route 92D because the number of requested wirings is 10 and the number of arrangeable wirings is also 10. In addition, the total number of wirings requested to connect the parts is displayed on each part to which schematic route(s) is(are) connected. For example, "90" is displayed on the part 91A. "40" is displayed on the part 91B. "110" is displayed on the part 91C. "60" is displayed on the part 91D. In this state, as illustrated in the right-side view in FIG. 11, when arrangement positions of the part 91C and the part 91D are changed to the upper side, a region of the schematic route 92B on which wirings are capable of being arranged is narrower. For this reason, only 10 wirings are capable of being arranged on the schematic route 92B. The part 91A and the part 91D are also connected by the schematic route 92D. Then, in the example of the right-side view in FIG. 11, the wirings on the schematic route 92B are distributed to the schematic route 92D. If the wirings are distributed in this manner, even when the parts and the like are moved and wirings that are incapable of being arranged on the schematic route are generated, the wirings can be distributed to another schematic route that connects the same parts. This makes it possible to perform layout design easily.

Referring back to FIG. 1, the bypass route generating unit 46 performs various types of generation. When the schematic route interferes with the parts or other schematic routes arranged on the substrate, for example, the bypass route generating unit 46 generates a schematic route bypassing along the shape of the parts or other schematic routes that interfere with the schematic route instead of the schematic route. The bypass route generating unit 46, for example, reads the wiring width and the allowable interval from the mounting specification information 30. The bypass route generating unit 46 calculates a width W of a schematic route from the number of requested wirings, the wiring width, and the allowable interval for the schematic route on which the number of arrangeable wirings is smaller than the number of requested wirings. The bypass route generating unit 46, for example, performs an operation of "the number of requested wirings×(wiring width+allowable interval)−allowable interval" so as to calculate the width W of the schematic route. Then, the bypass route generating unit 46 obtains check regions by enlarging widths of the parts and the forbidden region on the substrate other than the two parts connected by the schematic route by W/2. Furthermore, the bypass route generating unit 46 obtains check regions by enlarging widths of other schematic routes that are already arranged by widths each obtained by adding the allowable interval to W/2.

Then, the bypass route generating unit 46 determines whether the schematic route on which the number of arrangeable wirings is smaller than the number of requested wirings intersects with any of the check regions. When the schematic route intersects with the check region, the bypass route generating unit 46 generates a schematic route bypassing along the check region that intersects with the schematic route. When the number of arrangeable wirings on the bypassing schematic route is larger than the number of arrangeable wirings on the original schematic route, the bypass route generating unit 46 updates information of the original schematic route stored in the schematic route information 33 by information of the bypassing schematic route.

Figure 12:
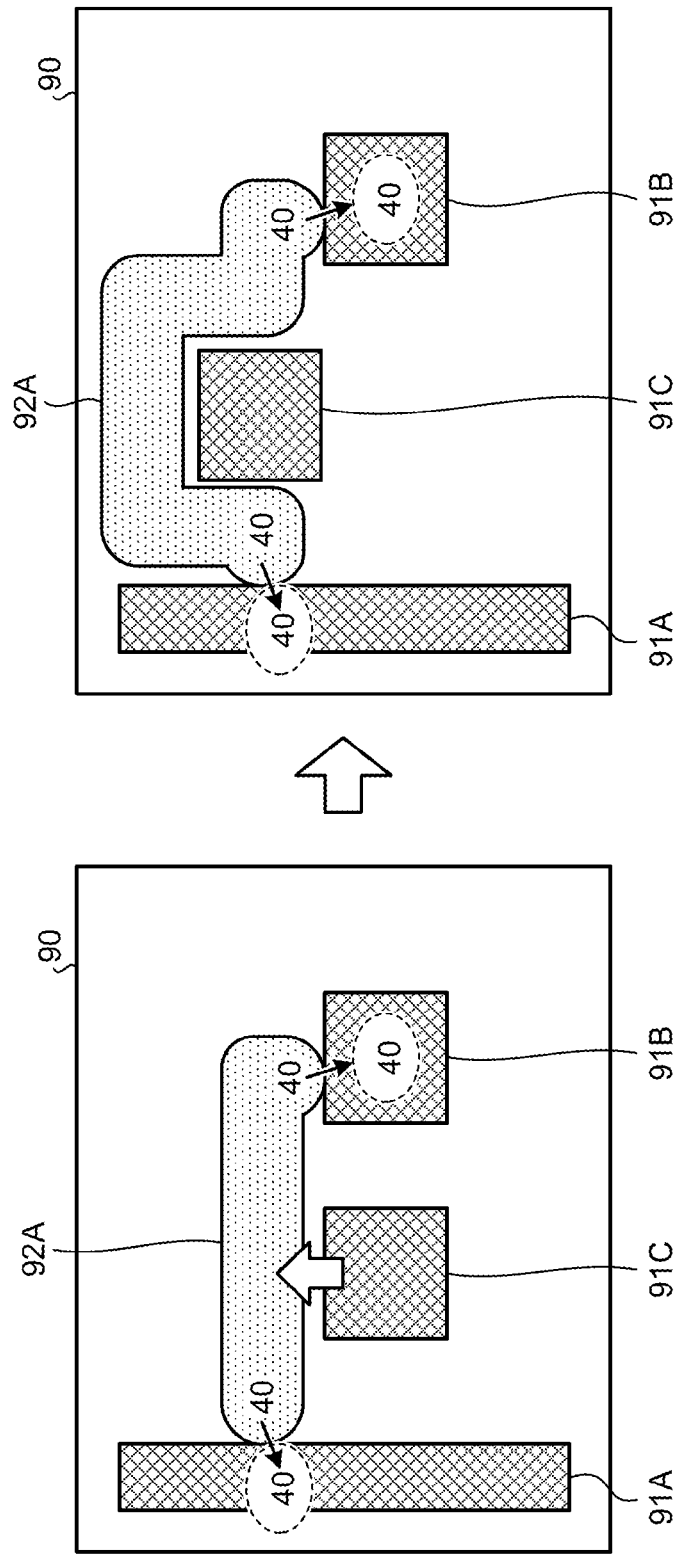
FIG. 12 is a view illustrating an example of a bypass route.

FIG. 12 is a view illustrating an example of the bypass route. In an example of the left-side view in FIG. 12, the part 91A and the part 91B on the substrate 90 are connected by the schematic route 92A. "40" is displayed on the schematic route 92A because the number of requested wirings is 40 and the number of arrangeable wirings is also 40. Furthermore, the total number of wirings requested to connect the parts is displayed on each part to which schematic route is connected. For example, "40" is displayed on the part 91A. "40" is displayed on the part 91B. In this state, as illustrated in the right-side view in FIG. 12, when an arrangement position of the part 91C is changed to the upper side, the schematic route 92A interferes with the part 91C. For this reason, the schematic route 92A is incapable of being arranged. Then, in an example of the right-side view in FIG. 12, a bypass route is generated and a wiring path is changed such that the schematic route 92A runs around the part 91C. If the bypass route is generated in this manner, even when the part or the like is moved and interferes with the schematic route, layout design can be performed easily because the bypass route is generated.

Referring back to FIG. 1, the display controller 47 performs various types of display control. The display controller 47, for example, controls to display a design screen. The display controller 47, for example, controls to display schematic routes on the design screen based on the result of pieces of processing by the receiving unit 41, the generating unit 42, the derivation unit 43, the searching unit 44, the distributing unit 45, and the bypass route generating unit 46. Furthermore, when the display controller 47 receives an operation of changing a schematic route displayed on the design screen from the input unit 21, the display controller 47 controls to change the schematic route in accordance with the operation. When the display controller 47 receives an operation of moving the position of a part, the display controller 47 controls to move the part in accordance with the operation and update a path of the schematic route connecting the part that is moved with the movement of the part. Moreover, when an operation of directing to rotate a part is performed, the display controller 47 rotates the part in one direction by a predetermined angle and displays the part. When an operation of directing to rotate the part is performed, for example, the display controller 47 rotates the part in one direction by 90 degrees each time and displays the part.

Figure 13:
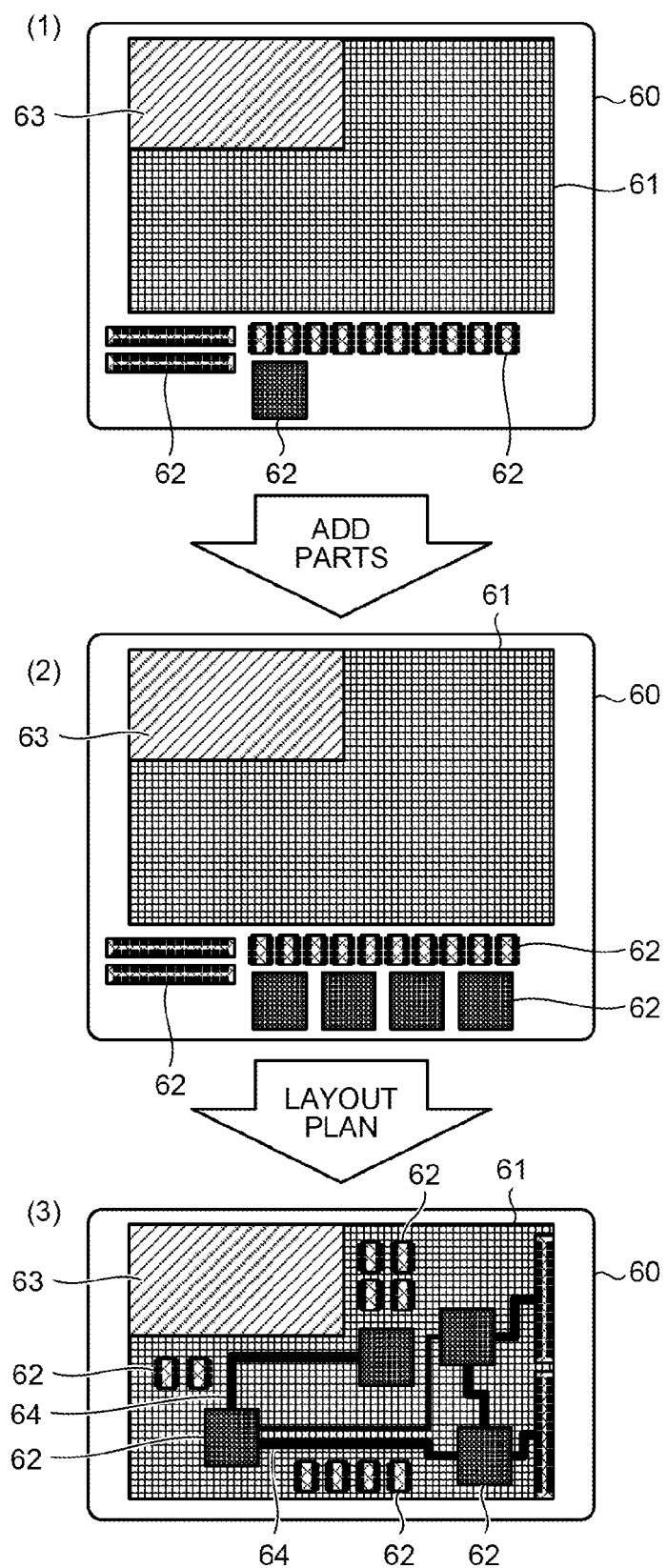
FIG. 13 is a view for explaining the procedure of layout design.

Next, described is the procedure of layout design by the design support apparatus 10 according to the embodiment. FIG. 13 is a view for explaining the procedure of layout design. The design screen 60 displays the substrate 61 as a design target based on the substrate information 31. The substrate 61 is provided with the forbidden region 63 on which wirings are incapable of being arranged based on the forbidden region information 34. The parts 62 are arranged on the periphery of the substrate 61 on the design screen 60 based on the part information 32. When parts are registered from the registration screen, for example, the registered parts 62 are added onto the design screen 60.

A designer performs layout design by using the design screen 60. For example, the designer arranges various types of parts 62 on the substrate 61. When the designer arranges wirings, the designer performs a predetermined operation to display the specification screen 70 on which conditions relating to the wirings are specified and direct to arrange the wirings. For example, the designer inputs a part name at a starting point onto the input region 71, inputs a part name at an ending point onto the input region 72, and inputs the number of connecting wirings onto the input region 73 on the specification screen 70. Then, the designer specifies the addition button 74.

With this, the schematic route 64 is generated as wiring connecting the parts 62 and is displayed on the design screen 60. The designer performs layout design by using the design screen 60 as follows. That is, the designer arranges the parts, specifies the parts to be connected by the wirings and the number of wirings, and connects the parts by using the schematic route.

Thus, the design support apparatus 10 specifies parts to be connected and the number of wirings so as to generate a schematic route. This makes it possible to perform layout design of the substrate from an early stage of design at which terminals of parts and network information that relates the terminals are not defined. In particular, parts having a large number of terminals have a large number of wirings to be connected and a large space for wirings is needed therearound. For this reason, the layout design of the substrate is performed at the early stage of design so as to suppress generation of rework on the design of the parts. The design support apparatus 10 checks interference to verify whether the generated schematic route is capable of being arranged on the substrate so as to derive the number of arrangeable wirings. This makes it possible to examine whether the wirings are capable of being arranged.

Figure 14:
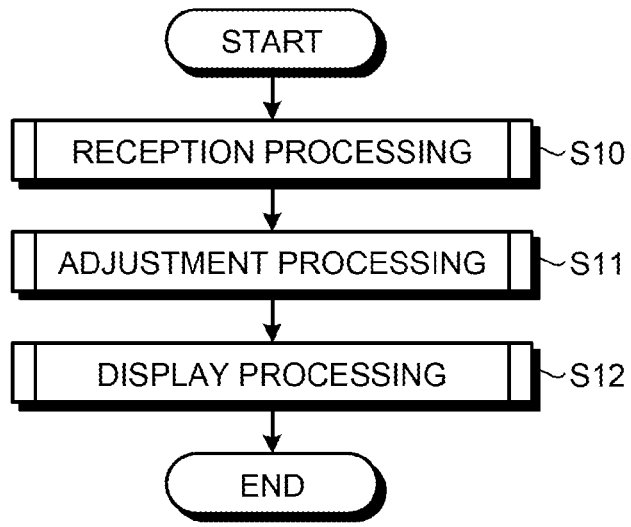
FIG. 14 is a flowchart illustrating procedures of generation processing.

Next, described is the procedure of processing of supporting the layout design by the design support apparatus 10 according to the embodiment. First, described is the procedure of generation processing of generating a schematic route by the design support apparatus 10 according to the embodiment. FIG. 14 is a flowchart illustrating procedures of the generation processing. The generation processing, for example, is executed at timing when a predetermined operation for directing to arrange wirings is performed on the design screen.

The controller 24 performs reception processing of receiving parts for which wirings are to be laid out (Step S10). With the reception processing, specification of the parts for which wirings are to be laid out is received, so that schematic routes connecting the specified parts are generated.

Then, the controller 24 performs adjustment processing of adjusting the generated schematic routes (Step S11). With the adjustment processing, adjustment of distributing wirings and searching a bypass route for the schematic route on which the specified number of wirings are incapable of being arranged.

Thereafter, the controller 24 performs display processing of displaying the schematic routes (Step S12) and finishes the processing. With the display processing, the schematic routes are displayed on the design screen 60.

Figure 15:
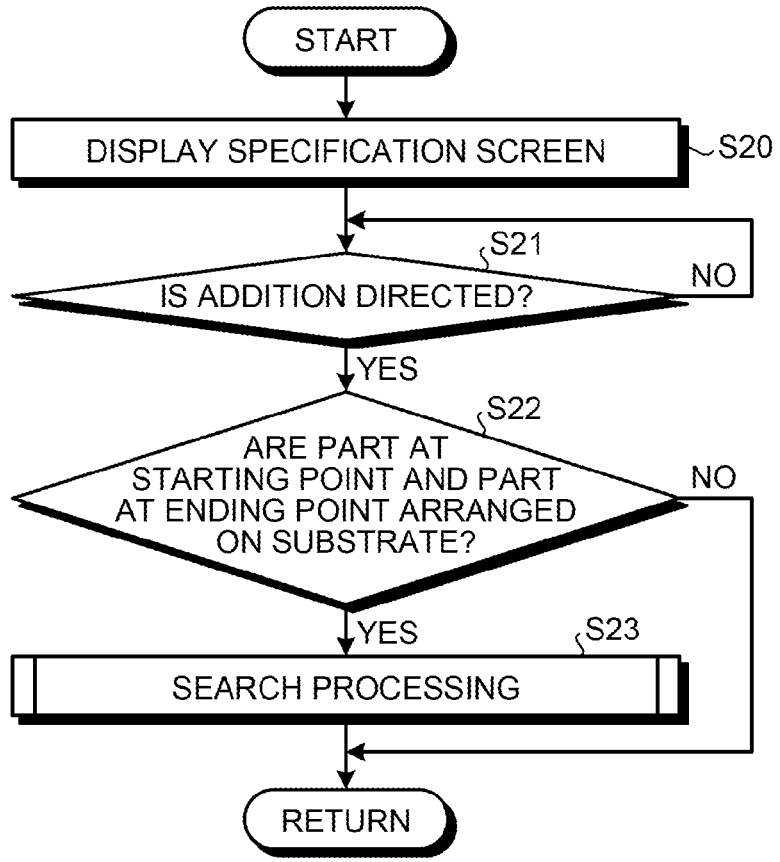
FIG. 15 is a flowchart illustrating procedures of reception processing.

Next, described is the procedure of the reception processing according to the embodiment. FIG. 15 is a flowchart illustrating procedures of the reception processing. The reception processing is executed from the processing at Step S10 in the generation processing as illustrated in FIG. 14.

The receiving unit 41 displays the specification screen 70 (Step S20) and receives specification of two parts to be connected and the number of connecting wirings from the specification screen 70. The receiving unit 41 determines whether the addition button 74 is selected on the specification screen 70 and addition of wiring is directed (Step S21). When the addition of the wiring is not directed (No at Step S21), the process shifts to the processing at Step S21, again, and waits for specification.

By contrast, when the addition of the wiring is directed (Yes at Step S21), the generating unit 42 determines whether two parts at the starting point and the ending point that are specified on the specification screen 70 are arranged on the substrate (Step S22). When the two parts are not arranged on the substrate (No at Step S22), the process shifts to an invoker of the reception processing.

By contrast, when the two parts are arranged on the substrate (Yes at Step S22), the generating unit 42 performs search processing of searching a schematic route of wirings connecting the two parts (Step S23) and the process shifts to the invoker of the reception processing after the search processing is finished. With the search processing, a schematic route connecting the two parts at the starting point and the ending point is generated.

Figure 16:
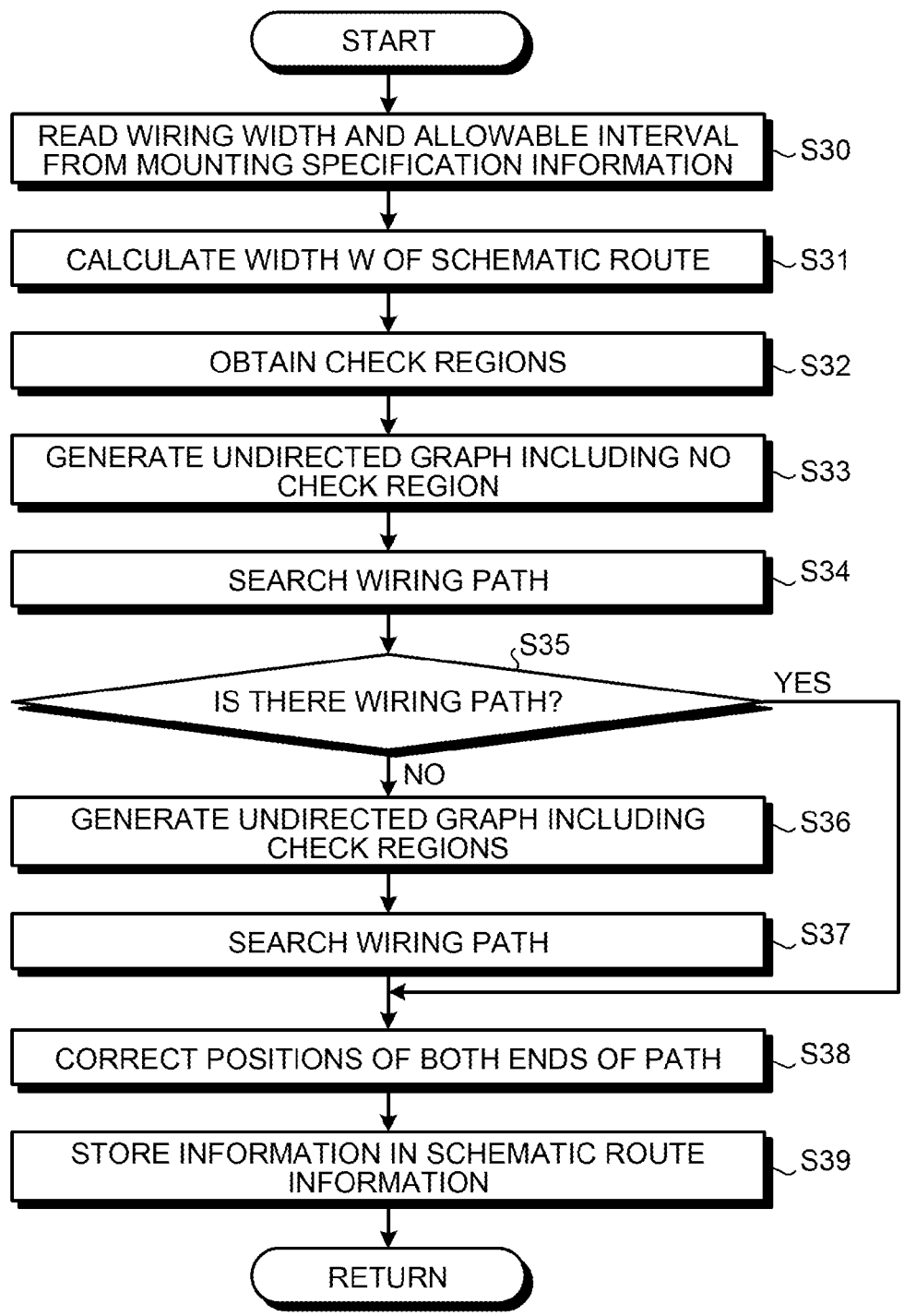
FIG. 16 is a flowchart illustrating procedures of search processing.

Next, described is the procedure of the search processing according to the embodiment. FIG. 16 is a flowchart illustrating procedures of the search processing. The search processing is executed from the processing at Step S23 in the reception processing as illustrated in FIG. 15.

The generating unit 42 reads a wiring width and an allowable interval from the mounting specification information 30 (Step S30). Then, the generating unit 42 calculates a width W of the schematic route from the number of wirings requested on the specification screen 70, the wiring width, and the allowable interval (Step S31). The generating unit 42, for example, performs an operation of "the number of requested wirings×(wiring width+allowable interval)−allowable interval" so as to calculate the width W of the schematic route.

The generating unit 42 obtains check regions that are used for determining whether the schematic route is capable of being arranged (Step S32). The generating unit 42, for example, obtains check regions by enlarging widths of the parts on the substrate and the forbidden region on the substrate other than the two parts specified on the specification screen 70 by W/2. Furthermore, the generating unit 42 obtains check regions by enlarging widths of other schematic routes that are already arranged by widths each obtained by adding the allowable interval to W/2.

The generating unit 42 specifies a region that is not included in the check regions on the substrate and generates an undirected graph in which grids on the region that is not included in the check regions are set as nodes and lines connecting upper, lower, right, and left grids are set as edges (Step S33). Then, the generating unit 42 searches the wiring path from the generated undirected graph by using a route search algorithm such as a maze method, for example (Step S34).

The generating unit 42 determines whether there is a wiring path as a result of the search (Step S35). When there is the wiring path (Yes at Step S35), the process shifts to processing at Step S38, which will be described later.

When there is no wiring path (No at Step S35), the generating unit 42 generates an undirected graph in which all the grids on the substrate are set as nodes and lines connecting upper, lower, right, and left grids are set as edges (Step S36). That is to say, in the processing at Step S36, the generating unit 42 generates an undirected graph including the check regions without excluding the grids on the check regions. Then, the generating unit 42 searches the wiring path from the generated undirected graph by using the route search algorithm such as a maze method, for example (Step S37).

The generating unit 42 corrects both ends of the searched wiring path to positions of the parts specified on the specification screen 70 (Step S38). Then, the generating unit 42 stores, in the schematic route information 33, information relating to the two parts at the starting point and the ending point that are specified on the specification screen 70, the number of connecting wirings, and the corrected wiring path (Step S39). Thereafter, the process shifts to an invoker of the search processing.

Figure 17:
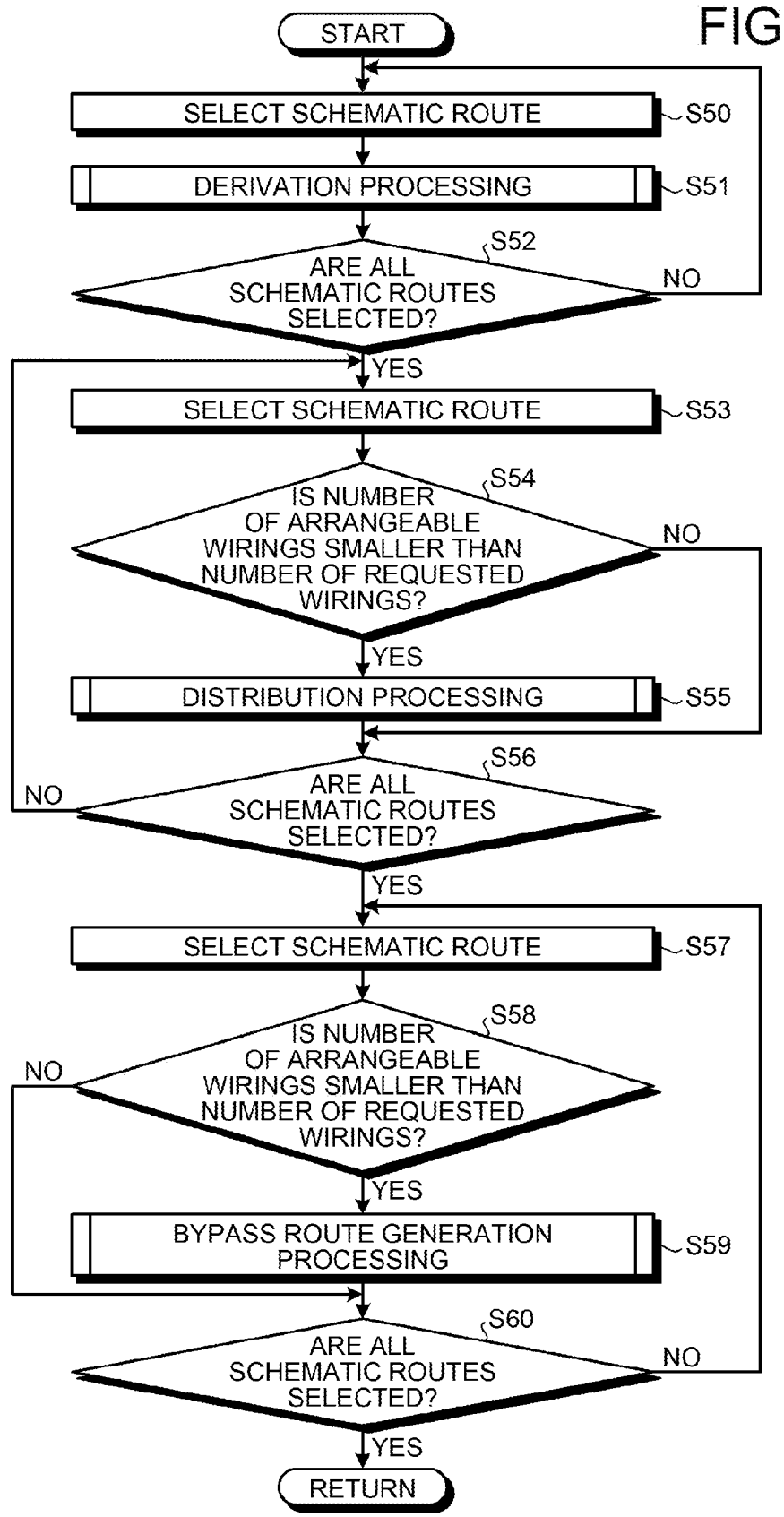
FIG. 17 is a flowchart illustrating procedures of adjustment processing.
Figure 22:
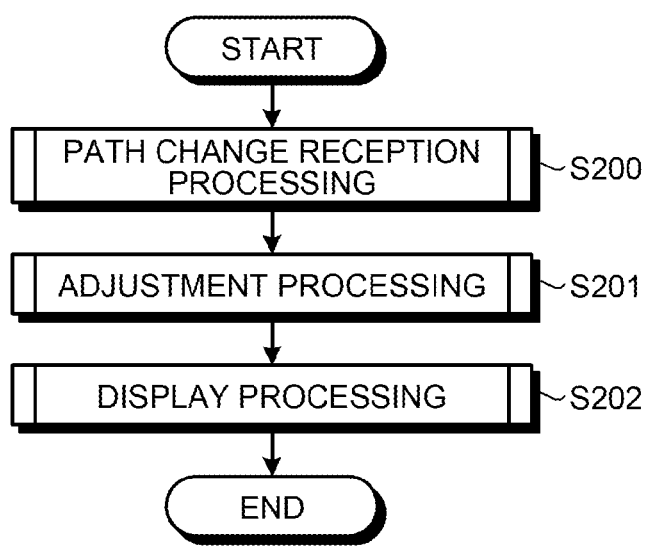
FIG. 22 is a flowchart illustrating procedures of path change processing.
Figure 24:
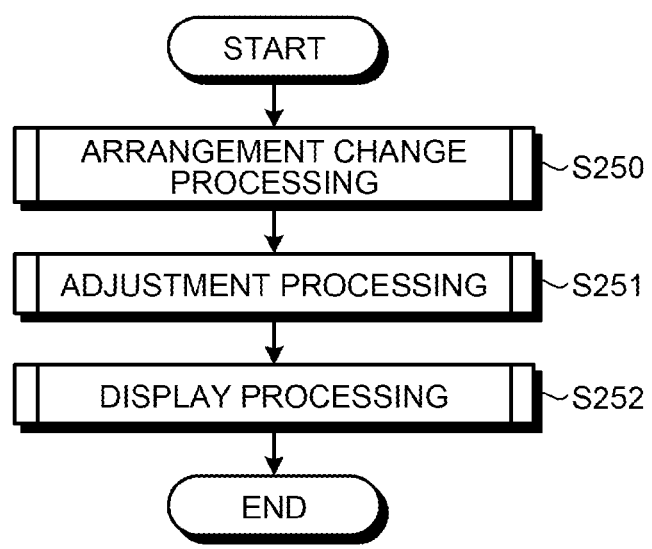
FIG. 24 is a flowchart illustrating procedures of part movement processing.

Next, described is the procedure of the adjustment processing according to the embodiment. FIG. 17 is a flowchart illustrating procedures of the adjustment processing. The adjustment processing is executed from the processing at Step S11 in the generation processing as illustrated in FIG. 14, processing at Step S201 in path change processing as illustrated in FIG. 22, and processing at Step S251 in part movement processing as illustrated in FIG. 24.

The derivation unit 43 selects one unselected schematic route from the generated schematic routes based on the schematic route information 33 (Step S50). Then, the derivation unit 43 performs derivation processing of deriving the number of arrangeable wirings while the schematic route selected by the above-mentioned processing at Step S50 is set as a processing target (Step S51). With the derivation processing, the number of arrangeable wirings to be arranged on the selected schematic route is derived.

The derivation unit 43 determines whether all the schematic routes are selected by the above-mentioned processing at Step S50 (Step S52). When all the schematic routes are not selected (No at Step S52), the process shifts to the processing at Step S50.

When all the schematic routes are selected (Yes at Step S52), the derivation unit 43 selects one unselected schematic route from the generated schematic routes based on the schematic route information 33 (Step S53). Then, the derivation unit 43 determines whether the number of arrangeable wirings on the selected schematic route is smaller than the number of requested wirings (Step S54). When the number of arrangeable wirings is equal to or larger than the number of requested wirings (No at Step S54), the process shifts to processing at Step S56, which will be described later. That is to say, when the number of arrangeable wirings is equal to or larger than the number of requested wirings, wirings for the requested number are capable of being arranged on the schematic route and distribution of the wirings is not needed to be performed. For this reason, the process shifts to the processing at Step S56, which will be described later.

By contrast, when the number of arrangeable wirings is smaller than the number of requested wirings (Yes at Step S54), the distributing unit 45 performs distribution processing of distributing wirings that are incapable of being arranged while the schematic route selected by the above-mentioned processing at Step S53 is set as a processing target (Step S55). With the distribution processing, the number of arrangeable wirings on the selected schematic route is derived.

The distributing unit 45 determines whether all the schematic routes are selected completely by the above-mentioned processing at Step S53 (Step S56). When all the schematic routes are not selected (No at Step S56), the process shifts to the processing at Step S53.

When all the schematic routes are selected (Yes at Step S56), the bypass route generating unit 46 selects one unselected schematic route from the generated schematic routes based on the schematic route information 33 (Step S57). Then, the bypass route generating unit 46 determines whether the number of arrangeable wirings on the selected schematic route is smaller than the number of requested wirings (Step S58). When the number of arrangeable wirings is equal to or larger than the number of requested wirings (No at Step S58), the process shifts to processing at Step S60, which will be described later. That is to say, when the number of arrangeable wirings is equal to or larger than the number of requested wirings and the wirings for the requested number are capable of being arranged on the schematic route, search of a bypass route is not needed to be performed. For this reason, the process shifts to the processing at Step S60, which will be described later.

By contrast, when the number of arrangeable wirings is smaller than the number of requested wirings (Yes at Step S58), the bypass route generating unit 46 performs bypass route generation processing of generating a bypass route on which wirings are capable of being arranged while the schematic route selected by the above-mentioned processing at Step S57 is set as a processing target (Step S59). With the bypass route generation processing, the bypass route for the schematic route on which wirings are not capable of being arranged is generated.

The bypass route generating unit 46 determines whether all the schematic routes are selected by the above-mentioned processing at Step S57 (Step S60). When all the schematic routes are not selected (No at Step S60), the process shifts to the processing at Step S57.

When all the schematic routes are selected (Yes at Step S60), the process shifts to an invoker of the adjustment processing.

Figure 18:
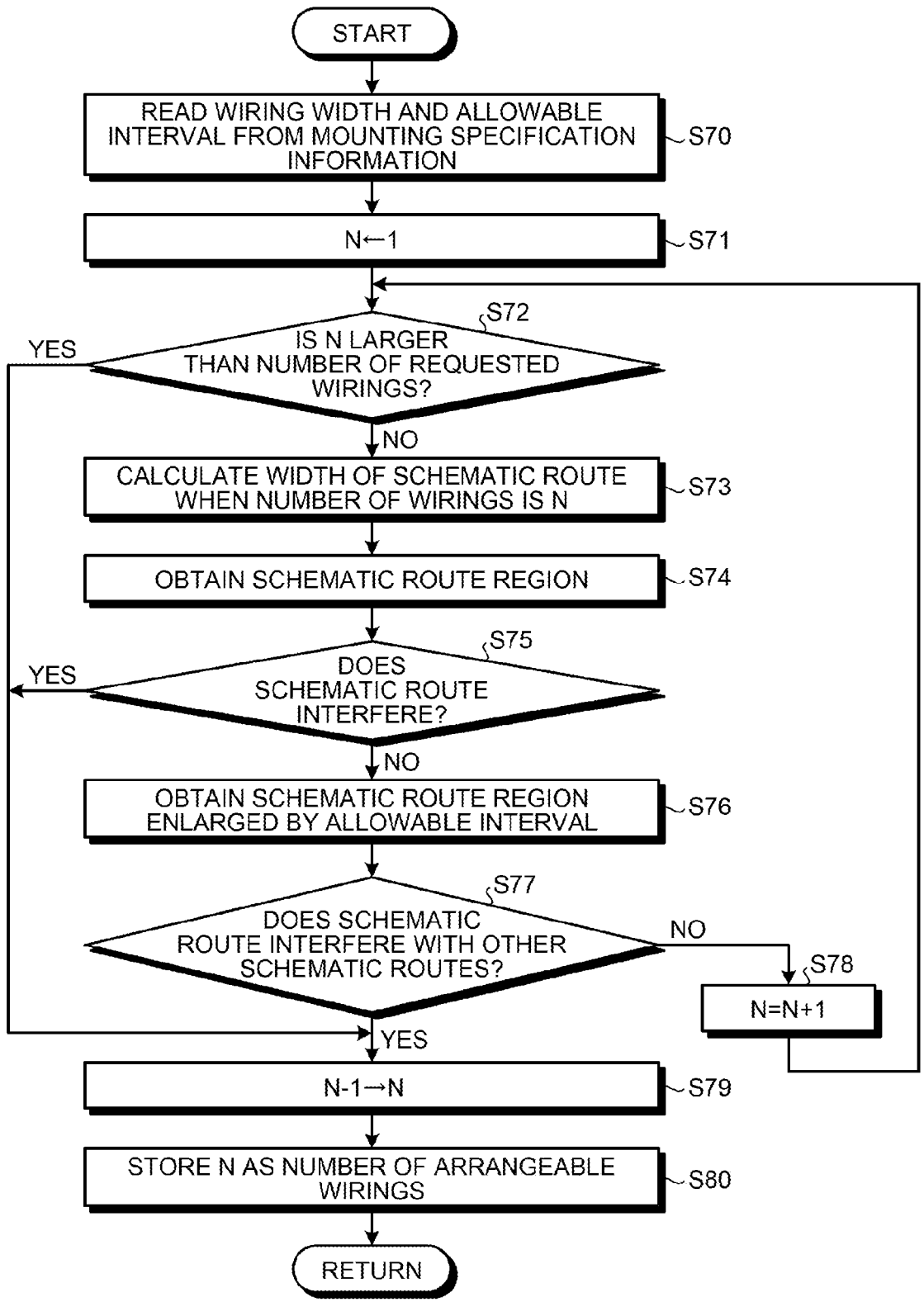
FIG. 18 is a flowchart illustrating procedures of derivation processing.
Figure 20:
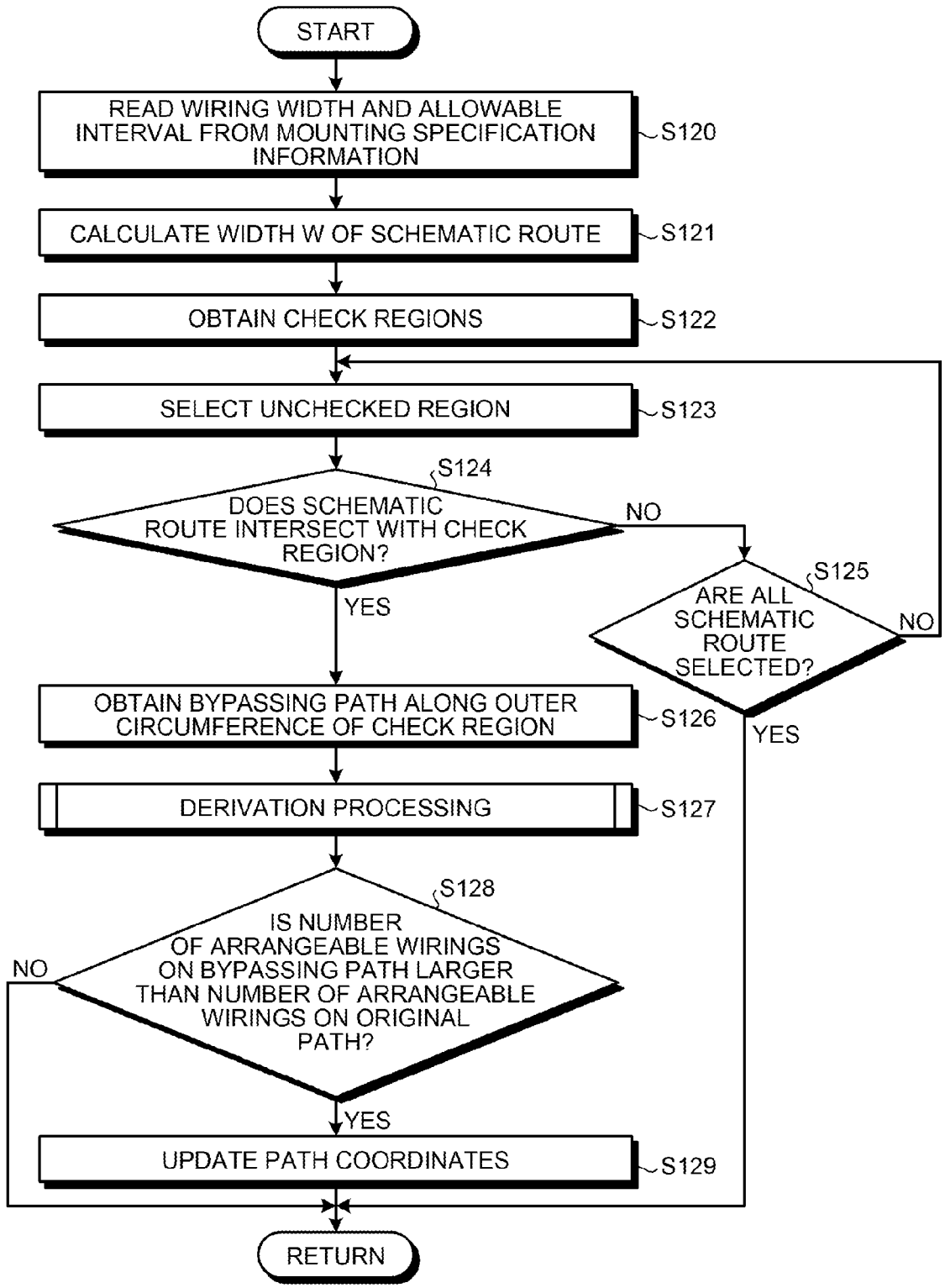
FIG. 20 is a flowchart illustrating procedures of bypass route generation processing.

Next, described is the procedure of the derivation processing according to the embodiment. FIG. 18 is a flowchart illustrating procedures of the derivation processing. The derivation processing is executed from the processing at Step S51 in the adjustment processing as illustrated in FIG. 17 and processing at Step S127 in the bypass route generation processing as illustrated in FIG. 20.

The derivation unit 43 reads the wiring width and the allowable interval from the mounting specification information 30 (Step S70). Then, the derivation unit 43 sets 1 to a variable N (Step S71). The derivation unit 43 determines whether a value of the variable N is larger than the number of requested wirings on the schematic route serving as a processing target (Step S72). When the value of the variable N is larger than the number of requested wirings (Yes at Step S72), the process shifts to processing at Step S79, which will be described later.

By contrast, when the value of the variable N is equal to or smaller than the number of requested wirings (No at Step S72), the derivation unit 43 performs an operation of "value of variable N×(wiring width+allowable interval)−allowable interval" so as to calculate the width W of the schematic route when the number of wirings is the value of the variable N (Step S73). The derivation unit 43 obtains a schematic route region having the width W along the schematic route serving as the processing target (Step S74). The derivation unit 43 determines whether the schematic route region interferes with the parts or the forbidden region (Step S75). The derivation unit 43, for example, determines whether the schematic route is overlapped with any of other parts on the substrate and the forbidden region on the substrate. When the schematic route region interferes (Yes at Step S75), the process shifts to the processing at Step S79, which will be described later.

By contrast, when the schematic route region does not interfere (No at Step S75), the derivation unit 43 obtains a schematic route region having the width W enlarged along the schematic route serving as the processing target by enlarging the width W by the allowable interval (Step S76). The derivation unit 43 determines whether the schematic route region having the enlarged width W interferes with other schematic routes arranged on the substrate (Step S77). The derivation unit 43, for example, determines whether the schematic route region is overlapped with any of other schematic routes arranged on the substrate. When the schematic route region interferes (Yes at Step S77), the process shifts to the processing at Step S79, which will be described later.

By contrast, when the schematic route region does not interfere (No at Step S77), the derivation unit 43 adds 1 to the value of the variable N (Step S78), and then, the process shifts to the above-mentioned processing at Step S72.

The derivation unit 43 subtracts 1 from the value of the variable N (Step S79). The derivation unit 43 stores, in the schematic route information 33, the value of the variable N as the number of arrangeable wirings that are capable of being arranged on the schematic route serving as the processing target (Step S80) and the process shifts to an invoker of the derivation processing.

Figure 19:
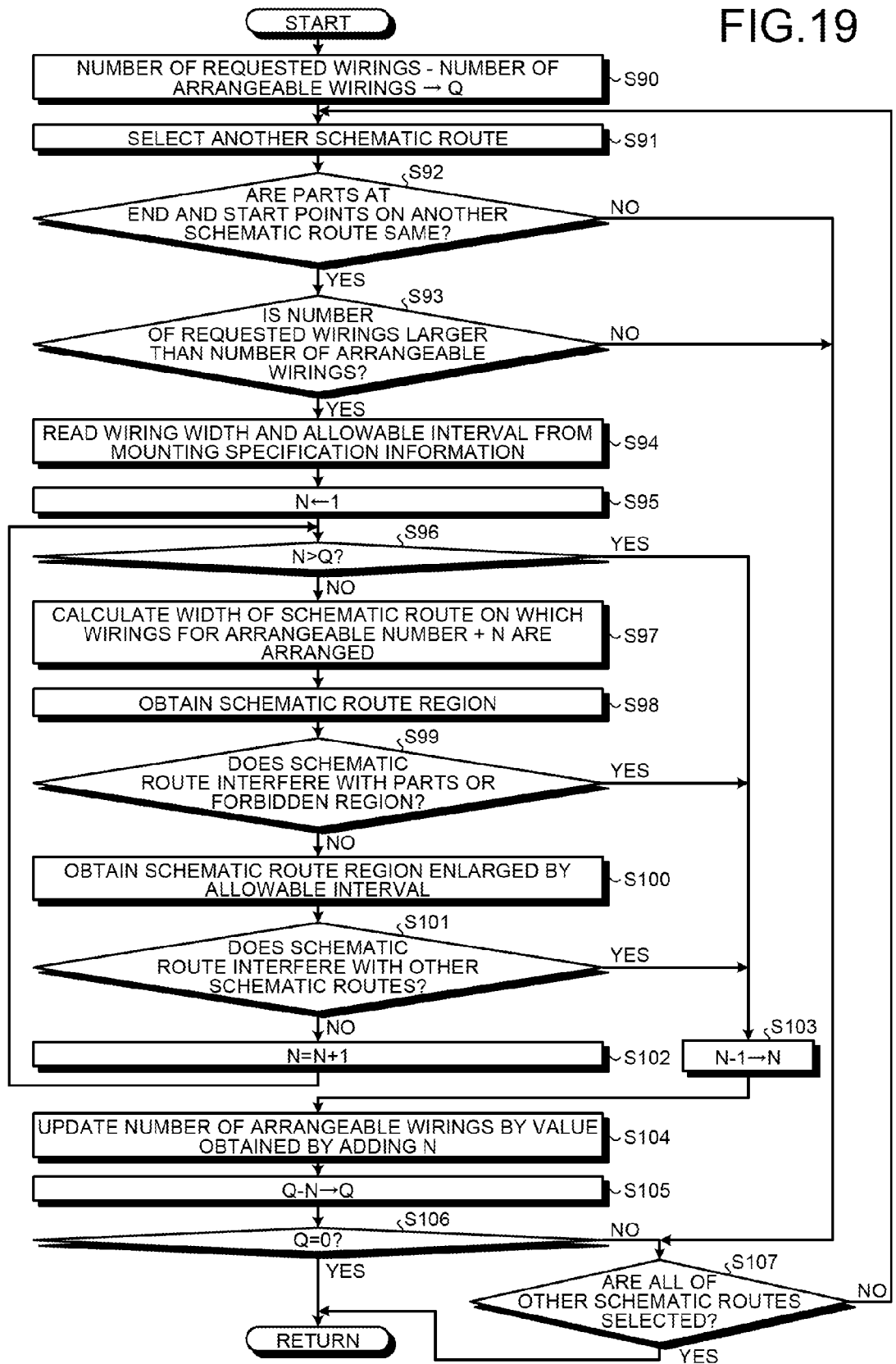
FIG. 19 is a flowchart illustrating procedures of distribution processing.

Next, described is the procedure of the distribution processing according to the embodiment. FIG. 19 is a flowchart illustrating procedures of the distribution processing. The distribution processing is executed from the processing at Step S55 in the adjustment processing as illustrated in FIG. 17.

The searching unit 44 subtracts the number of arrangeable wirings from the number of requested wirings so as to calculate the number of unarrangeable wirings Q for the schematic route serving as the processing target (Step S90). The searching unit 44 selects one unselected schematic route other than the schematic route serving as the processing target from the schematic route information 33 (Step S91).

The searching unit 44 determines whether the parts at the starting point and the ending point on the schematic route serving as the processing target and the parts at the starting point and the ending point on another schematic route selected by the processing at Step S91 are the same (Step S92). When the parts are not the same (No at Step S92), the process shifts to processing at Step S107, which will be described later.

By contrast, when the parts are the same (Yes at Step S92), the searching unit 44 determines whether the number of arrangeable wirings on another schematic route selected by the processing at Step S91 is equal to or larger than the number of requested wirings (Step S93). When the number of arrangeable wirings on another schematic route is smaller than the number of requested wirings (No at Step S93), the process shifts to the processing at Step S107, which will be described later. That is to say, when the wirings for the requested number are incapable of being arranged on another schematic route, It is difficult to distribute the wirings to another schematic route. For this reason, distribution of the wirings is not performed and the process shifts to the processing at Step S107, which will be described later.

By contrast, when the number of arrangeable wirings on another schematic route is equal to or larger than the number of requested wirings (Yes at Step S93), the distributing unit 45 reads the wiring width and the allowable interval from the mounting specification information 30 (Step S94). Then, the distributing unit 45 sets 1 to the variable N (Step S95). The derivation unit 43 determines whether the value of the variable N is larger than the value of the number of unarrangeable wirings Q (Step S96). When the value of the variable N is larger than the value of the number of unarrangeable wirings Q (Yes at Step S96), the process shifts to processing at Step S103, which will be described later.

By contrast, when the value of the variable N is equal to or smaller than the value of the number of unarrangeable wirings Q (No at Step S96), the distributing unit 45 calculates a width W of the schematic route obtained by increasing the number of wirings of another schematic route selected by the processing at Step S91 by 1 (Step S97). The distributing unit 45, for example, performs an operation of "(the number of arrangeable wirings on another schematic route+value of variable N)×(wiring width+allowable interval)−allowable interval" so as to calculate the width W of the schematic route. The distributing unit 45 obtains a schematic route region having the width W along another schematic route selected by the above-mentioned processing at Step S91 (Step S98). The distributing unit 45 determines whether the schematic route region interferes with the parts or the forbidden region (Step S99). The distributing unit 45, for example, determines whether the schematic route region is overlapped with any of other parts on the substrate or the forbidden region on the substrate. When the schematic route region interferes (Yes at Step S99), the process shifts to the processing at Step S103, which will be described later.

By contrast, when the schematic route region does not interfere (No at Step S99), the distributing unit 45 obtains a schematic route region having the width W enlarged along another schematic route selected by the above-mentioned processing at Step S91 by enlarging the width W by the allowable interval (Step S100). The distributing unit 45 determines whether the schematic route region having the enlarged width W interferes with other schematic routes arranged on the substrate (Step S101). The distributing unit 45, for example, determines whether the schematic route region is overlapped with any of other schematic routes arranged on the substrate. When the schematic route region interferes (Yes at Step S101), the process shifts to the processing at Step S103, which will be described later.

By contrast, when the schematic route region does not interfere (No at Step S101), the distributing unit 45 adds 1 to the value of the variable N (Step S102), and then, the process shifts to the above-mentioned processing at Step S96.

The derivation unit 43 updates the value of the variable N by a value obtained by subtracting 1 from the value (Step S103). The distributing unit 45 updates the value of the number of arrangeable wirings stored in the schematic route information 33 for another schematic route selected by the above-mentioned processing at Step S91 by a value obtained by adding the value of the variable N to the number of arrangeable wirings (Step S104). The distributing unit 45 updates the value of the number of unarrangeable wirings Q by a value obtained by subtracting the value of the variable N from the value of the number of unarrangeable wirings Q (Step S105).

With the pieces of processing at Step S92 to Step S105, wirings are distributed to another schematic route whose parts at the starting point and the ending point are the same.

The distributing unit 45 determines whether the value of the number of unarrangeable wirings Q is 0 (Step S106). When the value of the number of unarrangeable wirings Q is 0 (Yes at Step S106), the process shifts to an invoker of the distribution processing.

By contrast, when the value of the number of unarrangeable wirings Q is not 0 (No at Step S106), the distributing unit 45 determines whether all of other schematic routes other than the schematic route serving as the processing target are selected from the schematic route information 33 (Step S107). When all of other schematic routes are selected (Yes at Step S107), the process shifts to the invoker of the distribution processing. By contrast, when all of other schematic routes are not selected (No at Step S107), the process shifts to the above-mentioned processing at Step S91.

Next, described is the procedure of the bypass route generation processing according to the embodiment. FIG. 20 is a flowchart illustrating procedures of the bypass route generation processing. The bypass route generation processing is executed from the processing at Step S59 in the adjustment processing as illustrated in FIG. 17.

The bypass route generating unit 46 reads the wiring width and the allowable interval from the mounting specification information 30 (Step S120). Then, the bypass route generating unit 46 calculates a width W of the schematic route from the number of requested wirings, the wiring width, and the allowable interval for the schematic route serving as the processing target (Step S121). The generating unit 42, for example, performs an operation of "the number of requested wirings×(wiring width+allowable interval)−allowable interval" so as to calculate the width W of the schematic route.

The bypass route generating unit 46 obtains check regions to be used for checking whether the schematic route serving as the processing target is capable of being arranged (Step S122). The bypass route generating unit 46, for example, obtains check regions by enlarging widths of the parts on the substrate and the forbidden region on the substrate other than the two parts connected by the schematic route serving as the processing target by W/2. Furthermore, the generating unit 42 obtains check regions by enlarging widths of other schematic routes that are already arranged by widths each obtained by adding the allowable interval to W/2.

The bypass route generating unit 46 selects one unselected check region from the check regions obtained by the above-mentioned processing at Step S122 (Step S123). The bypass route generating unit 46 determines whether the schematic route serving as the processing target intersects with the check region selected by the above-mentioned processing at Step S123 (Step S124). When the schematic route intersects with the check region (Yes at Step S124), the process shifts to processing at Step S126, which will be described later.

By contrast, when the schematic route does not intersect with the check region (No at Step S124), the bypass route generating unit 46 determines whether all the schematic routes are selected by the above-mentioned processing at Step S123 (Step S125). When all the schematic routes are selected (Yes at Step S125), the process shifts to an invoker of the bypass route generation processing. By contrast, when all the schematic routes are not selected (No at Step S125), the process shifts to the above-mentioned processing at Step S123.

The bypass route generating unit 46 obtains a bypassing schematic route along the check region that intersects with the schematic route (Step S126). The bypass route generating unit 46 performs the derivation processing of deriving the number of arrangeable wirings while the bypassing schematic route is set as the processing target (Step S127). With the derivation processing, the number of arrangeable wirings on the bypassing schematic route is derived.

The bypass route generating unit 46 determines whether the number of arrangeable wirings on the bypassing schematic route is larger than the number of arrangeable wirings on the schematic route serving as the processing target (Step S128). When the number of arrangeable wirings on the bypassing schematic route is larger (Yes at Step S128), the bypass route generating unit 46 updates information of path coordinates of the schematic route serving as the processing target by information of path coordinates of the bypassing schematic route (Step S129). The bypass route generating unit 46, for example, updates information of the schematic route serving as the processing target stored in the schematic route information 33 by information of the bypassing schematic route. Then, the process shifts to the invoker of the bypass route generation processing.

By contrast, when the number of arrangeable wirings on the bypassing schematic route is not larger (No at Step S128), the process shifts to the invoker of the bypass route generation processing.

Figure 21:
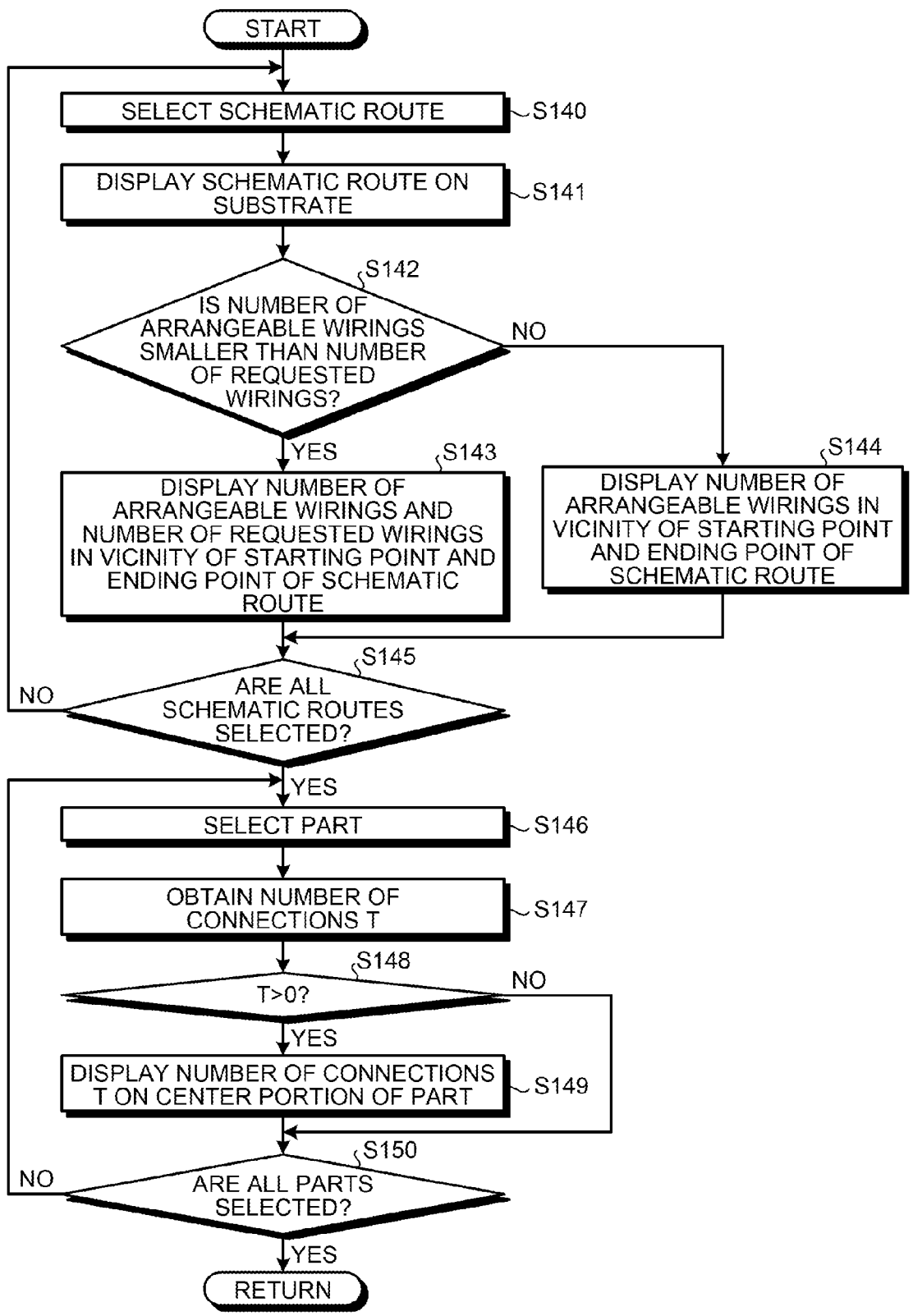
FIG. 21 is a flowchart illustrating procedures of display processing.

Next, described is the procedure of the display processing according to the embodiment. FIG. 21 is a flowchart illustrating procedures of the display processing. The display processing is executed from the processing at Step S12 in the generation processing as illustrated in FIG. 14, processing at Step S202 in the path change processing as illustrated in FIG. 22, and processing at Step S252 in the part movement processing as illustrated in FIG. 24.

The display controller 47 selects one unselected schematic route from the generated schematic routes based on the schematic route information 33 (Step S140). Then, the display controller 47 displays the selected schematic route on the substrate (Step S141). The display controller 47 determines whether the number of arrangeable wirings on the selected schematic route is smaller than the number of requested wirings (Step S142). When the number of arrangeable wirings is smaller than the number of requested wirings (Yes at Step S142), the display controller 47 displays the number of arrangeable wirings and the number of requested wirings in the vicinity of the parts at the starting point and the ending point of the schematic route (Step S143). By contrast, when the number of arrangeable wirings is equal to or larger than the number of requested wirings (No at Step S142), the display controller 47 displays the number of arrangeable wirings in the vicinity of the parts at the starting point and the ending point of the schematic route (Step S144).

The display controller 47 determines whether all the schematic routes are selected by the above-mentioned processing at Step S140 (Step S145). When all the schematic routes are selected (Yes at Step S145), the process shifts to processing at Step S146, which will be described later. By contrast, when all the schematic routes are not selected (No at Step S145), the process shifts to the above-mentioned processing at Step S140.

The display controller 47 selects one unselected part from the parts arranged on the substrate based on the part information 32 (Step S146). Then, the display controller 47 obtains a schematic route including the selected part from the schematic route information 33 so as to obtain the number of connections T by adding the number of requested wirings on the schematic route (Step S147). The display controller 47 determines whether the number of connections T is larger than 0 (Step S148). When the number of connections T is larger than 0 (Yes at Step S148), the display controller 47 displays a value of the number of connections T at a center portion of the part arranged on the substrate (Step S149). By contrast, when the number of connections T is 0 (No at Step S148), the process shifts to processing at Step S150, which will be described later.

The display controller 47 determines whether all the parts are selected by the above-mentioned processing at Step S146 (Step S150). When all the parts are not selected (No at Step S150), the process shifts to the above-mentioned processing at Step S146. By contrast, when all the parts are selected (Yes at Step S150), the process shifts to an invoker of the display processing.

Next, described is the procedure of the path change processing in which the design support apparatus 10 according to the embodiment changes a path of the schematic route in accordance with an operation by a designer. FIG. 22 is a flowchart illustrating procedures of the path change processing. The path change processing, for example, is executed at timing when any one of the schematic routes on the substrate that are displayed on the design screen is selected.

The controller 24 performs path change reception processing of receiving change of a path of the schematic route (Step S200). With the path change reception processing, the path of the schematic route is changed to the specified path.

Then, the controller 24 performs the above-mentioned adjustment processing of adjusting the schematic route (Step S201). Subsequently, the controller 24 performs the above-mentioned display processing of displaying the schematic route (Step S202). Then, the process is finished.

Figure 23:
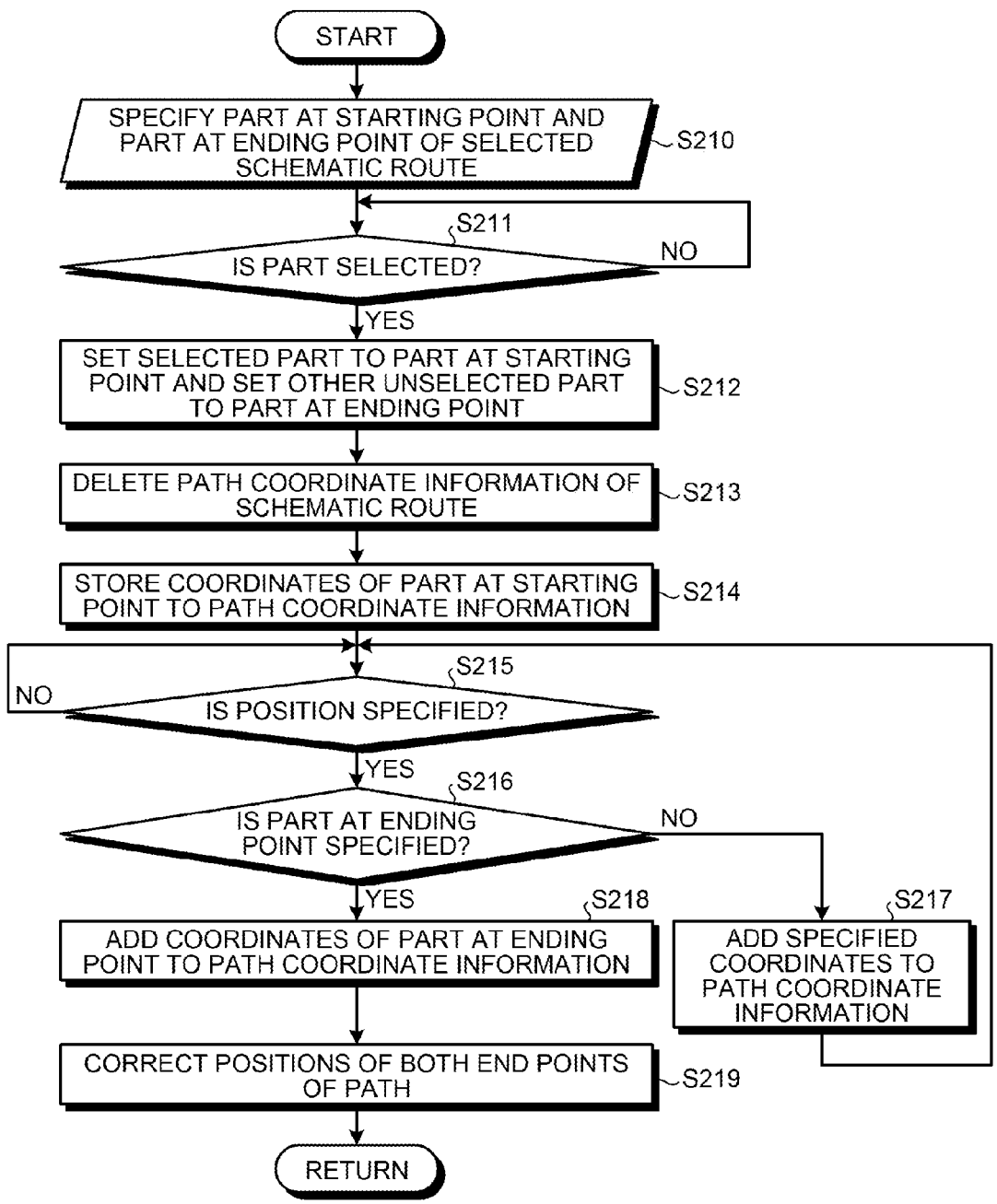
FIG. 23 is a flowchart illustrating procedures of path change reception processing.

Next, described is the procedure of the path change reception processing according to the embodiment. FIG. 23 is a flowchart illustrating procedures of the path change reception processing. The path change reception processing is executed from the processing at Step S200 in the path change processing as illustrated in FIG. 22.

The display controller 47 specifies parts at the starting point and the ending point of the schematic route selected on the substrate based on the schematic route information 33 (Step S210). The display controller 47 determines whether any of the two parts connected by the selected schematic route is selected (Step S211). When any of the two parts is not selected (No at Step S211), the process shifts to the processing at Step S211 again and waits for selection.

By contrast, when any of the two parts is selected (Yes at Step S211), the display controller 47 sets part names of parts at the starting point and the ending point on the selected schematic route to the schematic route information 33 while the selected part is set to the part at the starting point in the above-mentioned processing Step S211 and the other part is setting to the part at the ending point (Step S212).

The display controller 47 deletes information of the number of path coordinates and the path coordinates of the specified schematic route in the schematic route information 33 (Step S213). Thereafter, the display controller 47 stores the coordinates of the part at the starting point in information of the first path coordinates of the specified schematic route in the schematic route information 33 (Step S214).

The display controller 47 determines whether specification of a position on the substrate is received (Step S215). The display controller 47, for example, determines whether the substrate is clicked. When the position is not specified (No at Step S215), the process shifts to the above-mentioned processing at Step S215. By contrast, when the position is specified (Yes at Step S215), the display controller 47 determines whether the specified position is the position of the part at the ending point (Step S216). When the specified position is not the position of the part at the ending point (No at Step S216), the display controller 47 adds information of coordinates of the specified position to the path coordinates of the specified schematic route in the schematic route information 33 (Step S217) and the process shifts to the above-mentioned processing at Step S215, again.

By contrast, when the specified position is the position of the part at the ending point (Yes at Step S216), the display controller 47 adds information of the coordinates of the part at the ending point to the path coordinates of the specified schematic route in the schematic route information 33 (Step S218). The display controller 47 corrects positions of both ends of the wiring path indicated by the path coordinates in the schematic route information 33 to positions of the parts at the starting point and the ending point (Step S219). Then, the process shifts to an invoker of the path change reception processing.

Next, described is the procedure of the part movement processing in which the design support apparatus 10 according to the embodiment moves a part in accordance with an operation by a designer. FIG. 24 is a flowchart illustrating procedures of the part movement processing. The part movement processing, for example, is executed at timing when any of the parts displayed on the design screen is selected.

The controller 24 performs arrangement change processing of changing arrangement of the part (Step S250). With the arrangement change processing, the position of the specified part is changed.

Then, the controller 24 performs the above-mentioned adjustment processing of adjusting the schematic route (Step S251). Thereafter, the controller 24 performs the above-mentioned display processing of displaying the schematic route (Step S252), and the processing is finished.

Figure 25:
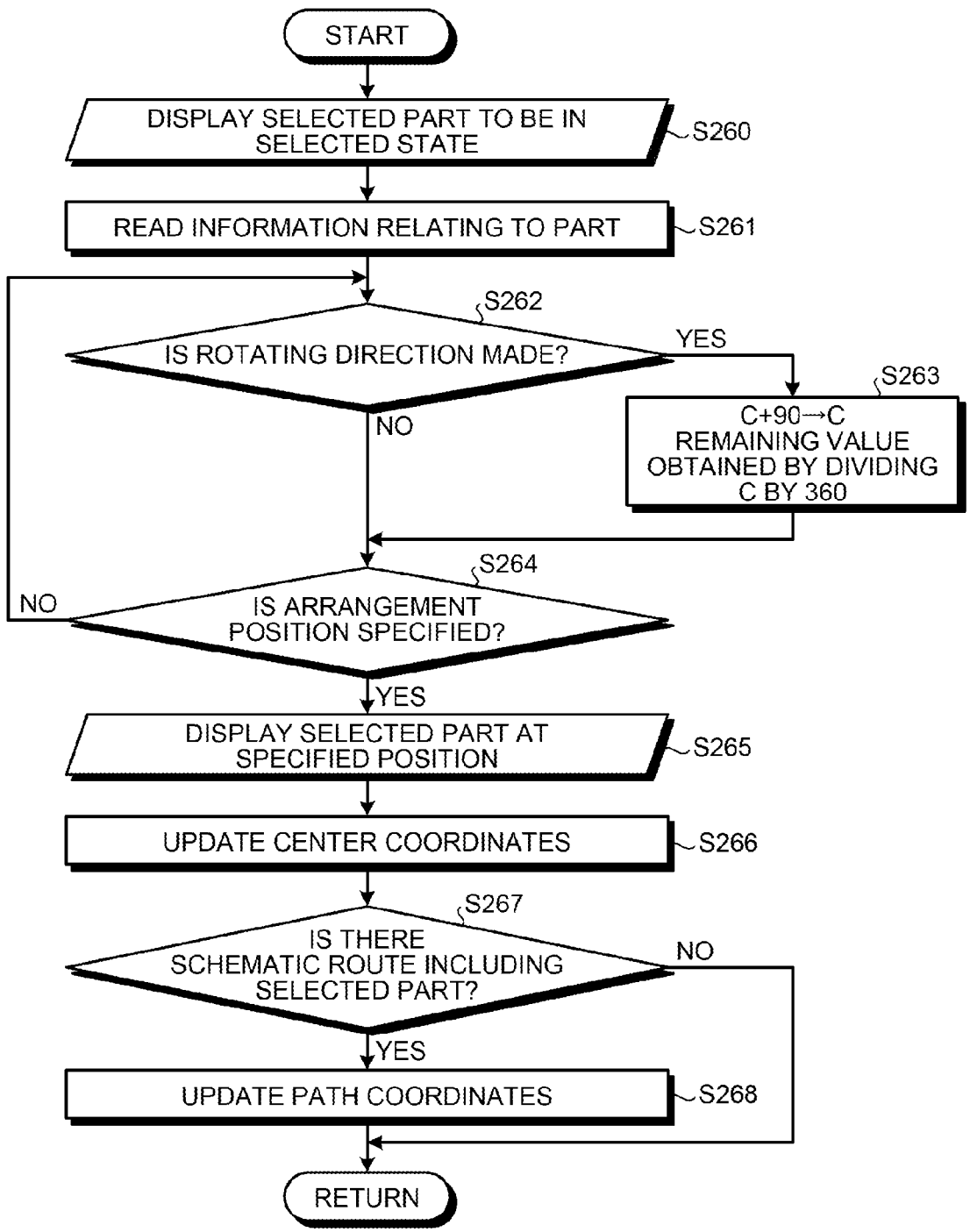
FIG. 25 is a flowchart illustrating procedures of arrangement change processing.

Next, described is the procedure of the arrangement change processing according to the embodiment. FIG. 25 is a flowchart illustrating procedures of the arrangement change processing. The arrangement change processing is executed from the processing at Step S250 in the part movement processing as illustrated in FIG. 24.

The display controller 47 displays the selected part to be in a selected state (Step S260). Furthermore, the display controller 47 reads information relating to the selected part from the part information (Step S261).

The display controller 47 determines whether an operation of directing to rotate the part is performed (Step S262). The display controller 47, for example, determines whether an "R" button is specified as the operation of directing to rotate the part. When the operation of directing to rotate the part is performed (Yes at Step S262), the display controller 47 rotates the selected part in one direction by 90 degrees and displays it, and also updates information relating to a rotating angle of the part by information after the rotation by 90 degrees (Step S263). When an angle of the selected part is assumed to be C, for example, the display controller 47 obtains a value of C+90 and sets a remaining value obtained by dividing C+90 by 360 to the angle C.

When the operation of directing to rotate the part is not performed (No at Step S262), the display controller 47 determines whether an operation of specifying an arrangement position of the part is performed (Step S264). The display controller 47, for example, determines whether the substrate is clicked as the operation of specifying the arrangement position of the part. When the operation of specifying the arrangement position of the part is not performed (No at Step S264), the process shifts to the above-mentioned processing at Step S262.

When the operation of specifying the arrangement position of the part is performed (Yes at Step S264), the display controller 47 displays the selected part at the specified position (Step S265). Then, the display controller 47 updates the center coordinates of the selected part in the part information 32 by coordinates of the specified position (Step S266).

The display controller 47 determines whether there is record indicating that the selected part corresponds to the part at the starting point or the part at the ending point from the schematic route information 33 (Step S267). When there is no record (No at Step S267), the process shifts to an invoker of the part movement processing.

By contrast, when there is the record (Yes at Step S267), the display controller 47 updates the path coordinates of the selected part by coordinates of the specified position (Step S268). When the selected part is the part at the starting point, for example, the display controller 47 updates the first path coordinates by coordinates of the specified position. Furthermore, when the selected part is the part at the ending point, the display controller 47 updates the last path coordinates by coordinates of the specified position. Then, the process shifts to the invoker of the part movement processing.

In this manner, the design support apparatus 10 receives specification of two parts to be connected by wirings and the number of connecting wirings. Then, the design support apparatus 10 generates a schematic route connecting the two parts on the substrate with a width in accordance with the received number of wirings. Thereafter, the design support apparatus 10 checks interference to verify whether the generated schematic route is capable of being arranged on the substrate and derives the number of arrangeable wirings. This enables the design support apparatus 10 to perform layout design of the substrate at the early stage of design.

When there is a schematic route on which the derived number of arrangeable wirings is smaller than the received number of wirings, the design support apparatus 10 searches another schematic route connecting the same parts as those on the schematic route. Then, the design support apparatus 10 distributes a part of wirings to another schematic route that is searched. With this, even when wirings that are not capable of being arranged on the schematic route are generated, the design support apparatus 10 is capable of distributing the wirings to another schematic route connecting the same parts. This makes it possible to perform layout design easily.

When the generated schematic route interferes with the part or another schematic route arranged on the substrate, the design support apparatus 10 generates a schematic route bypassing along the shape of the part or another schematic route that interferes with the schematic route instead of the generated schematic route. With this, even when interference with the schematic route occurs, the bypass route is generated, so that the design support apparatus 10 can perform layout design easily.

[b] Second Embodiment

Although the embodiment relating to the disclosed apparatus has been described, the disclosed technique may be carried out in various modes different from the above-mentioned embodiment. Hereinafter, described are other embodiments encompassed by the invention.

Although the generating unit 42 searches a wiring path to generate a schematic route in the above-mentioned embodiment, the disclosed apparatus is not limited thereto. For example, a developer may specify a path of the schematic route using the input unit 21 or a terminal apparatus such as a client computer that is capable of communicating with the design support apparatus 10 and the generating unit 42 may generate a schematic route along the specified path.

Although one mounting condition relating to wirings when the wirings are arranged on the substrate is stored in the mounting specification information 30 in the above-mentioned embodiment, the disclosed apparatus is not limited thereto. For example, a plurality of conditions may be stored based on types of the wirings and the schematic route may be generated to have a width in accordance with the type of the wirings. A designer may specify the type of the wirings. Alternatively, pieces of attribute information of parts may be stored in the parts in a correspondence manner and the type of the wirings may be determined based on the attribute information. For example, a type of a part to be used or a type of wirings to be used as the attribute information may be related to each part and the type of the wirings may be determined in accordance with the type of the part or the type of the wirings to be used indicated by the attribute information.

Furthermore, the controller 24 of the design support apparatus 10 according to the above-mentioned embodiment may include a replacement unit that replaces parts and schematic routes on the substrate by parts and wirings based on actual design data on a basis of the design data of the parts. The design support apparatus 10, for example, acquires the design data of the parts by using the acquisition unit 40 at a stage where circuit design is progressed and design of the parts is fixed. Then, the design support apparatus 10 may be configured such that the replacement unit replaces the parts and the schematic routes arranged schematically by data of actual design parts and wirings connecting the design parts based on the acquired design data. With this, the parts based on the design data can be arranged on the substrate at a stage where design is progressed, so that layout design of the parts on the substrate can be performed more smoothly.

Furthermore, the substrate in the above-mentioned embodiment may be a multilayered substrate. The design support apparatus 10 according to the above-mentioned embodiment performs layer design for each layer so as to perform layout design in the case of the multilayered substrate.

The respective constituent elements of each apparatus as illustrated in the drawings are functionally conceptual and are not necessarily configured physically as in the drawings. That is to say, specific states of division and integration of the respective apparatuses are not limited to those as illustrated in the drawings and the respective apparatuses can be configured by dividing and integrating all or a part of them functionally or physically based on an arbitrary unit in accordance with various loads and usage conditions. For example, the respective processors of the acquisition unit 40, the receiving unit 41, the generating unit 42, the derivation unit 43, the searching unit 44, the distributing unit 45, the bypass route generating unit 46, and the display controller 47 as illustrated in FIG. 1 may be divided or integrated appropriately. Furthermore, all or an arbitrary part of the respective processing functions to be executed by the respective processors can be executed by a central processing unit (CPU) and programs that are analyzed and executed on the CPU or executed as hardware by a wired logic.

Design Support Program

Figure 26:
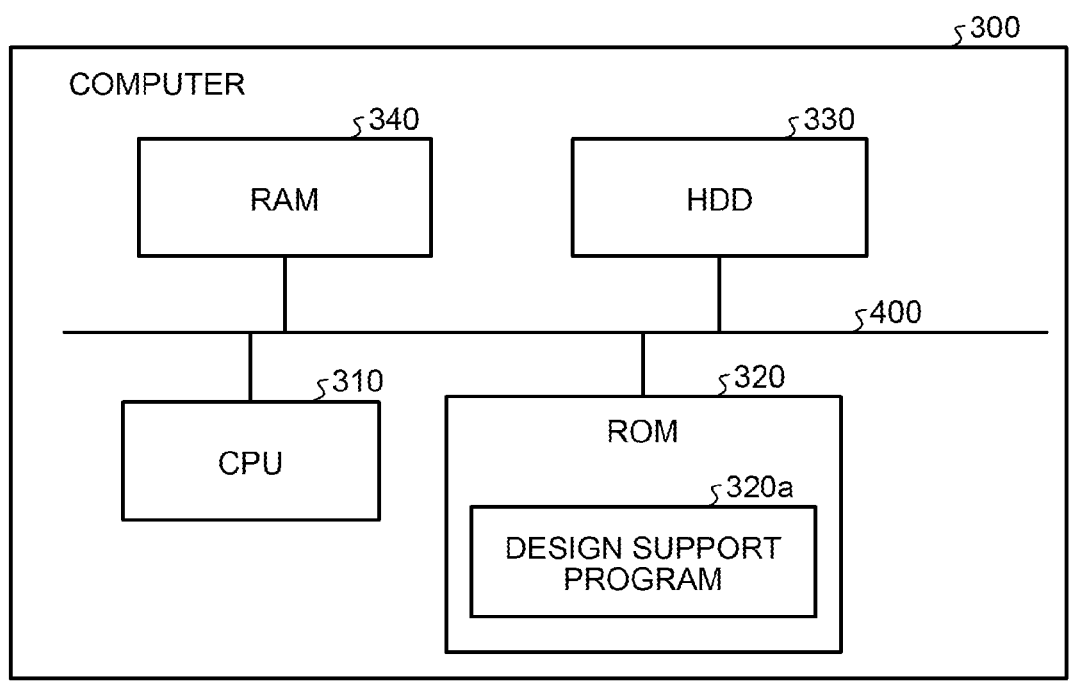
FIG. 26 is a diagram illustrating a computer that executes a design support program.

The various pieces of processing as described in the above-mentioned embodiment can be executed by executing previously prepared programs on a computer system such as a personal computer and a work station. Hereinafter, described is an example of the computer system that executes the programs having the same functions as those in the above-mentioned embodiment. FIG. 26 is a diagram illustrating a computer that executes a design support program.

As illustrated in FIG. 26, a computer 300 includes a CPU 310, a read only memory (ROM) 320, a hard disk drive (HDD) 330, and a random access memory (RAM) 340. The respective constituent components 310 to 340 are connected through a bus 400.

The ROM 320 stores a design support program 320a exhibiting the same functions as the respective processors in the above-mentioned embodiment previously. The ROM 320, for example, is made to store the design support program 320a exhibiting the same functions as those of the acquisition unit 40, the receiving unit 41, the generating unit 42, the derivation unit 43, the searching unit 44, the distributing unit 45, the bypass route generating unit 46, and the display controller 47 in the above-mentioned embodiment. Note that the design support program 320a may be separated appropriately.

The HDD 330 stores various pieces of data. The HDD 330, for example, stores various pieces of data that are used for estimating an OS and characteristics.

The CPU 310 loads the design support program 320a from the ROM 320 and executes it so as to execute the same operations as those by the respective processors in the above-mentioned embodiment. That is to say, the design support program 320a executes the same operations as those by the acquisition unit 40, the receiving unit 41, the generating unit 42, the derivation unit 43, the searching unit 44, the distributing unit 45, the bypass route generating unit 46, and the display controller 47 in the above-mentioned embodiment.

Note that the above-mentioned design support program 320a is not necessarily stored in the ROM 320 initially. The design support program 320a may be stored in the HDD 330.

For example, the program is stored in a "mobile physical medium" such as a flexible disk (FD), a compact disk read only memory (CD-ROM), a digital versatile disk (DVD), a magnetooptical disk, and an IC card that is inserted into the computer 300. Then, the computer 300 may load the program therefrom and execute it.

In addition, the program is stored in "another computer (or server)" that is connected to the computer 300 through a public line, the Internet, a LAN, a wide area network (WAN), or the like. Then, the computer 300 may load the program therefrom and execute it.

Layout design of a substrate can be performed at an early stage of design.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A design support apparatus comprising:
a receiving unit that receives specification of two parts to be connected by wirings and number of wirings connecting the two parts;
a generating unit that generates a schematic route connecting the two parts on a substrate with a width in accordance with the number of wirings received by the receiving unit;
a derivation unit that derives number of arrangeable wirings by checking interference of the schematic route generated by the generating unit when arranged on the substrate;
a searching unit that searches, when there is a schematic route on which the number of arrangeable wirings derived by the derivation unit is smaller than the number of wirings received by the receiving unit, another schematic route connecting parts that are same as parts connected by the first schematic route; and
a distributing unit that distributes a part of wirings to the other schematic route searched by the searching unit.

2. The design support apparatus according to claim 1, further comprising a bypass route generating unit that generates a schematic route bypassing along a shape of a part or another schematic route that interferes with the schematic route generated by the generating unit instead of the schematic route generated by the generating unit when the schematic route generated by the generating unit interferes with the part or the other schematic route arranged on the substrate.

3. A design support apparatus comprising:
a processor configured to execute a procedure, the procedure comprising:
generating a schematic route connecting two parts on a substrate with a width in accordance with number of wirings received by a receiving unit that receives specification of the two parts to be connected by wirings and the number of wirings connecting the two parts;
deriving number of arrangeable wirings by checking interference of the generated schematic route when arranged on the substrate;
searching, when there is a schematic route on which the number of derived arrangeable wirings is smaller than the number of wirings received by the receiving unit, another schematic route connecting parts that are same as parts connected by the first schematic route; and
distributing a part of wirings to the other schematic route searched in the searching.

4. A design support method for causing a computer to execute processing of:
- generating, by the computer, a schematic route connecting two parts on a substrate with a width in accordance with number of wirings received by a receiving unit that receives specification of the two parts to be connected by wirings and the number of wirings connecting the two parts;
- deriving, by the computer, number of arrangeable wirings by checking interference of the generated schematic route when arranged on the substrate;
- searching, by the computer, when there is a schematic route on which the number of derived arrangeable wirings is smaller than the number of wirings received by the receiving unit, another schematic route connecting parts that are same as parts connected by the first schematic route; and
- distributing, by the computer, a part of wirings to the other schematic route searched in the searching.

5. A computer-readable, non-transitory recording medium having stored therein a design support program for causing a computer to execute a process, the process comprising:
- generating a schematic route connecting two parts on a substrate with a width in accordance with number of wirings received by a receiving unit that receives specification of the two parts to be connected by wirings and the number of wirings connecting the two parts;
- deriving number of arrangeable wirings by checking interference of the generated schematic route when arranged on the substrate;
- searching, when there is a schematic route on which the number of derived arrangeable wirings is smaller than the number of wirings received by the receiving unit, another schematic route connecting parts that are same as parts connected by the first schematic route; and
- distributing a part of wirings to the other schematic route searched in the searching.

* * * * *